(12) United States Patent
Thiel et al.

(10) Patent No.: US 11,448,794 B2
(45) Date of Patent: Sep. 20, 2022

(54) TWO DIMENSIONAL PIXEL-BASED INVERSION

(71) Applicant: SCHLUMBERGER TECHNOLOGY CORPORATION, Sugar Land, TX (US)

(72) Inventors: Michael Thiel, Cambridge, MA (US); Dzevat Omeragic, Lexington, MA (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 527 days.

(21) Appl. No.: 15/772,255

(22) PCT Filed: Oct. 19, 2016

(86) PCT No.: PCT/US2016/057564
§ 371 (c)(1),
(2) Date: Apr. 30, 2018

(87) PCT Pub. No.: WO2017/074744
PCT Pub. Date: May 4, 2017

(65) Prior Publication Data
US 2018/0321415 A1    Nov. 8, 2018

Related U.S. Application Data

(60) Provisional application No. 62/248,826, filed on Oct. 30, 2015.

(51) Int. Cl.
*G01V 3/38* (2006.01)
*G01V 3/28* (2006.01)
(Continued)

(52) U.S. Cl.
CPC ............ *G01V 3/38* (2013.01); *E21B 7/04* (2013.01); *E21B 7/06* (2013.01); *E21B 41/0092* (2013.01);
(Continued)

(58) Field of Classification Search
CPC .. G01V 3/28; G01V 3/38; G06F 17/28; G06F 30/33; G06F 30/17; G06F 30/20;
(Continued)

(56) References Cited

U.S. PATENT DOCUMENTS 5,610,967 A * 3/1997 Moorman ............... A61B 6/12
378/154
5,644,612 A * 7/1997 Moorman ............... H01J 35/14
378/98.2
(Continued)

FOREIGN PATENT DOCUMENTS

WO    2015069282 A1    5/2015
WO    2015134455 A1    9/2015
(Continued)

OTHER PUBLICATIONS

Constable, S. C. et al., "Occam's Inversion: A Practical alogrithm for generating smooth models from electromagnetic sounding data", Geophysics, 1987, 52(3), pp. 289-300.
(Continued)

*Primary Examiner* — Thai Q Phan
(74) *Attorney, Agent, or Firm* — Trevor G. Grove

(57) ABSTRACT

Methods and systems for characterizing subterranean formations are described herein. One method includes performing electromagnetic logging measurements along a portion of a borehole traversing the subterranean formation using an electromagnetic logging tool to obtain electromagnetic data. The method also includes processing the electromagnetic data to determine a plurality of one dimensional formation
(Continued)

models associated with the portion of the borehole. A two dimensional pixel grid is determined using the plurality of one dimensional formation models. The method further includes determining a two dimensional formation model for the subterranean formation by performing an inversion of the electromagnetic data using the two dimensional pixel grid. The methods and systems described herein can be used to steer a bottom-hole assembly during well placement.

23 Claims, 10 Drawing Sheets

(51) Int. Cl.
E21B 49/00 (2006.01)
E21B 7/04 (2006.01)
G01B 21/00 (2006.01)
G06F 30/17 (2020.01)
G06F 30/20 (2020.01)
E21B 47/13 (2012.01)
E21B 7/06 (2006.01)
E21B 41/00 (2006.01)
G01V 99/00 (2009.01)

(52) U.S. Cl.
CPC .............. E21B 47/13 (2020.05); E21B 49/00 (2013.01); G01B 21/00 (2013.01); G01V 3/28 (2013.01); G01V 99/005 (2013.01); G06F 30/17 (2020.01); G06F 30/20 (2020.01)

(58) Field of Classification Search
CPC ... E21B 41/0092; G06T 5/002; H04N 5/7458; G01B 21/00
USPC .................................... 703/2, 11; 702/11, 16
See application file for complete search history.

(56) References Cited

U.S. PATENT DOCUMENTS

| 5,751,785 | A | * | 5/1998 | Moorman | A61B 6/12 378/146 |
| 6,594,584 | B1 | | 7/2003 | Omeragic et al. | |
| 6,798,208 | B2 | | 9/2004 | Omeragic | |
| 6,969,994 | B2 | | 11/2005 | Minerbo et al. | |
| 6,998,844 | B2 | | 2/2006 | Omeragic et al. | |
| 7,247,892 | B2 | * | 7/2007 | Taylor | B82Y 20/00 257/197 |
| 7,536,261 | B2 | | 5/2009 | Omeragic et al. | |
| 7,640,110 | B2 | | 12/2009 | Abubakar et al. | |
| 7,656,160 | B2 | | 2/2010 | Legendre et al. | |
| 7,746,334 | B2 | * | 6/2010 | Lee | G09G 3/3688 345/209 |
| 7,755,361 | B2 | | 7/2010 | Seydoux et al. | |
| 8,612,156 | B2 | * | 12/2013 | Gulati | G01V 1/34 702/16 |
| 8,754,650 | B2 | | 6/2014 | Legendre et al. | |
| 9,176,252 | B2 | * | 11/2015 | Liang | G01N 15/088 |
| 9,456,172 | B2 | * | 9/2016 | Naftali | H04N 5/7458 |
| 9,860,444 | B1 | * | 1/2018 | De La Cruz | G06T 5/002 |
| 10,036,826 | B2 | * | 7/2018 | Thiel | G01V 3/38 |
| 10,371,857 | B1 | * | 8/2019 | Venter | G06K 9/00476 |
| 10,429,537 | B2 | * | 10/2019 | Lin | G01V 3/38 |
| 10,641,921 | B1 | * | 5/2020 | Venter | G01V 3/38 |
| 10,648,316 | B2 | * | 5/2020 | Wilson | E21B 7/04 |
| 2002/0149997 | A1 | | 10/2002 | Zhang et al. | |
| 2006/0074561 | A1 | | 4/2006 | Xia et al. | |
| 2006/0095239 | A1 | | 5/2006 | Frenkel | |
| 2008/0133139 | A1 | | 6/2008 | Frenkel | |
| 2010/0165134 | A1 | * | 7/2010 | Dowski, Jr. | G02B 3/0025 348/218.1 |
| 2010/0185393 | A1 | * | 7/2010 | Liang | G01N 15/088 702/7 |
| 2011/0218737 | A1 | * | 9/2011 | Gulati | G06T 15/00 702/16 |
| 2011/0295510 | A1 | * | 12/2011 | Gulati | G01V 1/288 702/16 |
| 2012/0090834 | A1 | | 4/2012 | Imhof et al. | |
| 2014/0208852 | A1 | * | 7/2014 | Instanes | G01B 17/02 73/594 |
| 2014/0220713 | A1 | * | 8/2014 | Dowski, Jr. | H01L 27/14618 438/15 |
| 2014/0309937 | A1 | * | 10/2014 | Gulati | G01V 1/288 702/11 |
| 2014/0350859 | A1 | * | 11/2014 | Lin | G01V 3/26 702/7 |
| 2015/0292266 | A1 | | 10/2015 | Johnson et al. | |
| 2016/0033673 | A1 | * | 2/2016 | Liang | G01V 3/28 702/7 |
| 2017/0054958 | A1 | * | 2/2017 | Naftali | H04N 9/3129 |
| 2017/0075021 | A1 | * | 3/2017 | Thiel | E21B 47/13 |
| 2017/0096887 | A1 | * | 4/2017 | Wilson | G06F 17/11 |
| 2017/0160424 | A1 | | 6/2017 | Omeragic et al. | |
| 2017/0371072 | A1 | * | 12/2017 | Shetty | G01V 99/005 |

FOREIGN PATENT DOCUMENTS

| WO | WO-2015134455 A1 * | 9/2015 | ............ E21B 47/13 |
| WO | 2016130945 A1 | 8/2016 | |
| WO | 2017147217 A1 | 8/2017 | |
| WO | WO-2017147217 A1 * | 8/2017 | ............ E21B 47/13 |

OTHER PUBLICATIONS

Dennis Jr., J. E. et al., "Numerical Methods for Unconstrained Optimization and Non-Linear Equations", SIAM Classics in Applied Mathematics, 1996, 388 pages.
Dupuis, C. et al., "Workflow to Image Unconformities with Deep Electromagnetic LWD Measurements Enables Well Placement in Complex Scenarios", SPE 166117, presented at the SPE Annual Technical Conference and Exhibition, New Orleans, Louisiana, U.S.A., 2013, 18 pages.
Farquharson, C. G. et al., "A comparison of automatic techniques for estimating the regularization parameter in non-linear inverse problem", Geophysics Journal International, 2004, 156(1), pp. 411-425.
Seydoux, J. et al. "Full 3D Deep Directional Resistivity Measurements Optimize Well Placement and Provide Reservoir-Scale Imaging While Drilling", Transactions of the 55th Annual SPWLA Logging Symposium, Abu Dhabi, UAE, 2014, 14 pages.
Office Action issued in U.S. Appl. No. 16/079,125 dated Aug. 23, 2021, 39 pages.
Nocedal, J. et al., "Numerical Optimization", 2nd edition Spring Series in Operations Research, 2006.
Office Action issued in U.S. Appl. No. 16/079,125 dated Mar. 9, 2022, 47 pages.

* cited by examiner

TWO DIMENSIONAL PIXEL-BASED INVERSION

RELATED APPLICATIONS

This application claims the benefit of U.S. Provisional Application having Ser. No. 62/248,826 entitled "2D Pixel-Based Inversion Methods for Interpretation of Deep Directional Resistivity Measurements for Real-Time Well Placement and Reservoir Characterization" filed Oct. 30, 2015, which is incorporated in its entirety by reference herein.

BACKGROUND

Logging tools have long been used in wellbores to make formation evaluation measurements to infer properties of a formation surrounding a borehole and properties of fluids in the formation. Common logging tools include resistivity (electromagnetic) tools, nuclear tools, acoustic tools, and nuclear magnetic resonance (NMR) tools, though various other types of tools for evaluating formation properties are also available.

Early logging tools were run into a wellbore on a wireline cable after the wellbore had been drilled. Modern versions of such wireline tools are still used extensively. However, as the demand for information while drilling a borehole has continued to increase, measurement-while-drilling (MWD) tools and logging-while-drilling (LWD) tools have since been developed. MWD tools often provide drilling parameter information such as weight on the bit, torque, temperature, pressure, direction, and inclination. LWD tools often provide formation evaluation measurements such as resistivity, porosity, NMR distributions, and so forth. MWD and LWD tools often have characteristics common to wireline tools (e.g., transmitting and receiving antennas, sensors, etc.), however MWD and LWD tools are designed and constructed to operate and endure in the harsh environment of drilling.

Electromagnetic (EM) logging tools have been employed in the field of subsurface exploration for many years. These types of logging tools or instruments usually include an elongated support equipped with antennas that are operable as sources (transmitters) or sensors (receivers). The antennas on these tools are generally formed as loops or coils of conductive wires, and may be configured to have dipole moments that are axial (parallel with tool axis), transverse (perpendicular to the tool axis), or tilted (neither parallel nor perpendicular to the tool axis). In operation, a transmitter antenna is energized by an alternating current to emit EM energy through the borehole fluid ("mud") and into the surrounding formation or formations. As used herein, "formation" may refer to a single layer, multiple layers, faults, unconformities, geological bodies, and/or oil-water contacts. The emitted energy interacts with the borehole and formation to produce signals that are detected and measured by one or more receiver antennas. These detected signals reflect the interactions with the mud and the formation. The measurements are also affected by mud filtrate invasion that changes the properties of the rock near the wellbore. By processing the detected signal data, a log or profile of the formation and/or borehole properties is determined.

Using resistivity measurements made by LWD/MWD tools for well placement is commonly referred as in the industry as "geosteering." In geosteering, estimation of the borehole position in real-time with respect to known geological markers is performed through correlation of resistivity log features in order to make steering decisions. The accuracy of such steering decisions often depends, at least in part, on the inversion technique used.

The above descriptions and examples are not admitted to be prior art by virtue of their inclusion in this section.

SUMMARY

Illustrative embodiments of the present disclosure are directed to methods for characterizing subterranean formations. One method includes performing electromagnetic logging measurements along a portion of a borehole traversing the subterranean formation using an electromagnetic logging tool to obtain electromagnetic data. The method also includes processing the electromagnetic data to determine a plurality of one dimensional formation models associated with the portion of the borehole. A two dimensional pixel grid is determined using the plurality of one dimensional formation models. The method further includes determining a two dimensional formation model for the subterranean formation by performing an inversion of the electromagnetic data using the two dimensional pixel grid. The methods and systems described herein can be used to steer a bottom-hole assembly during well placement.

In various embodiments, the inversion of the electromagnetic data using the two dimensional pixel grid includes (i) modeling a response of the electromagnetic tool using the two dimensional pixel grid and (ii) performing the inversion of the electromagnetic data using the two dimensional pixel grid and the modeled response.

In some embodiments, the response of the electromagnetic tool is modelled for individual columns of the two dimensional pixel grid one at a time. In other embodiments, the response of the electromagnetic tool is modelled for a plurality of individual columns of the two dimensional pixel grid together.

Various embodiments of the present disclosure are directed to a system for characterizing a subterranean formation. The system includes an electromagnetic logging tool that performs electromagnetic logging measurements along a portion of a borehole traversing the subterranean formation to obtain electromagnetic data. The system also includes a processing system that (i) processes the electromagnetic data to determine a plurality of one dimensional formation models associated with the portion of the borehole, (ii) determines a two dimensional pixel grid using the plurality of one dimensional formation models, and (iii) determines a two dimensional formation model for the subterranean formation by performing an inversion of the electromagnetic data using the two dimensional pixel grid.

Further embodiments of the present disclosure are directed to methods for creating a composite two dimensional (2D) formation model from two different formation models. The method includes accessing a first two dimensional (2D) formation model modelling a first portion of a formation and accessing a second 2D formation model modelling a second portion of the formation. A domain of the first 2D formation model overlaps a domain of the second 2D formation model in an overlap region. The method also includes creating a composite two dimensional (2D) formation model of the first 2D formation model and the second 2D formation model by blending the first 2D formation model and the second 2D formation model in the overlap region.

This summary is not intended to identify key or essential features of the claimed subject matter, nor is it intended to be used as an aid in limiting the scope of the claimed subject matter.

BRIEF DESCRIPTION OF THE DRAWINGS

Features and advantages of the described implementations can be more readily understood by reference to the following description taken in conjunction with the accompanying drawings.

DETAILED DESCRIPTION

In the following description, numerous details are set forth to provide an understanding of some embodiments of the present disclosure. However, it will be understood by those of ordinary skill in the art that the system and/or methodology may be practiced without these details and that numerous variations or modifications from the described embodiments may be possible. Additionally, it should be understood that references to "one implementation", "one embodiment", "an implementation", "an embodiment", etc., within the present disclosure are not to be interpreted as excluding the existence of additional embodiments and implementations that also incorporate some or all of the recited features.

Illustrative embodiments of the present disclosure are directed to a two-dimensional pixel-based inversion method that can be used to efficiently determine a two dimension (2D) formation model from electromagnetic measurements of a subterranean formation. In one embodiment, the inversion method can be used to determine an approximate two dimensional (2D) formation model. The inversion method can be used to decrease and/or minimize error as compared to a local one dimensional (1D) approximation of a formation. The approximate 2D inversion method can be based on a 2D pixel discretization of the formation. Automatic regularization can be used to create a consistent inverted map of the formation with desirable detail. An underlying 1D electromagnetic modeling can be used for fast inversion results. In another embodiment, the inversion method can be used to determine a full 2D formation model, such that areas of a formation with one or more 2D formation features (such as, for example, a fault, etc.) can be modelled. The concepts and techniques of two dimensional pixel-based inversion can be used while drilling and/or after drilling is completed.

Example Wellsite System

Figure 1:
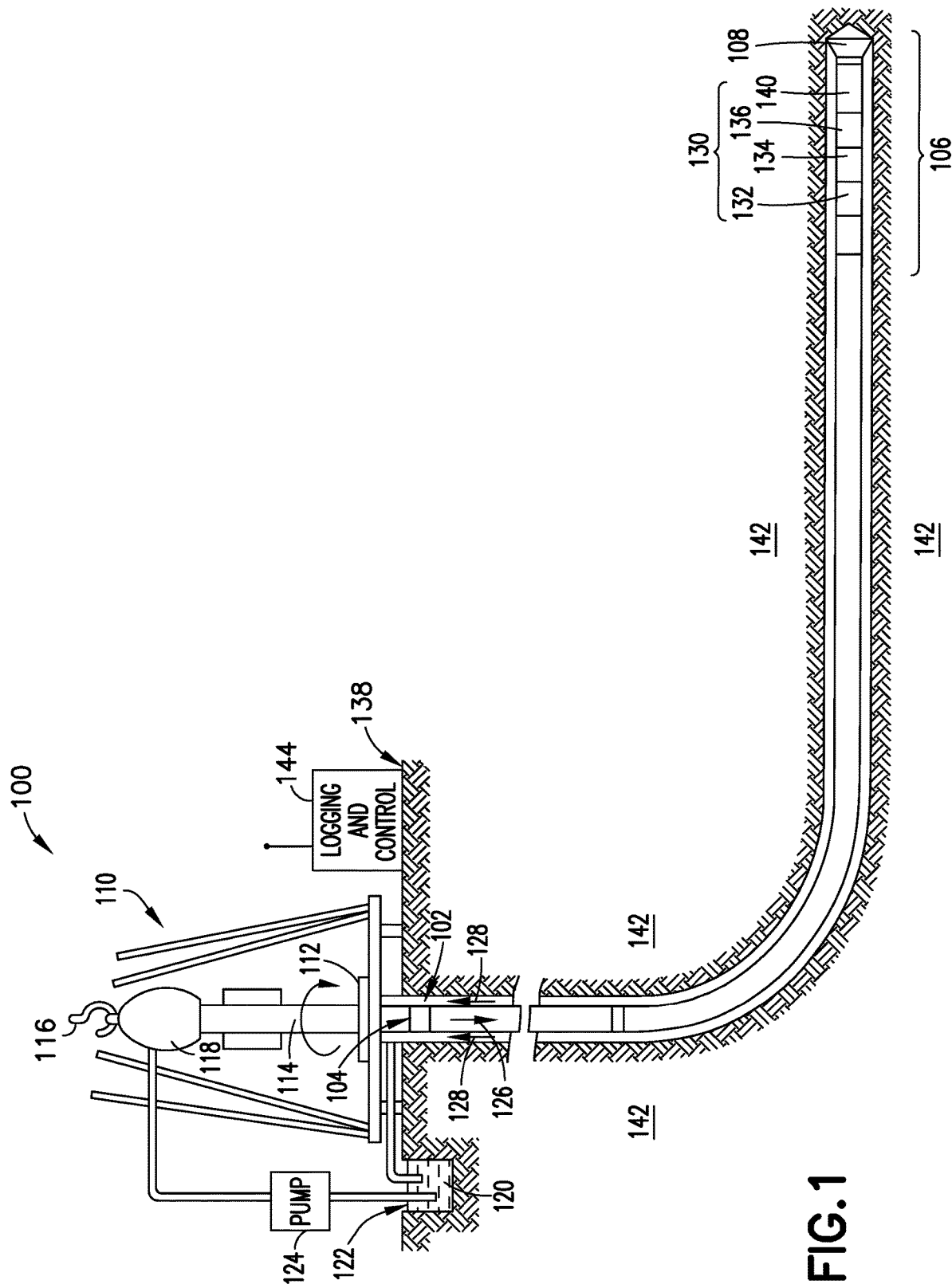
FIG. 1 illustrates an example wellsite system with which embodiments of two dimensional pixel-based inversion can be employed.

FIG. 1 illustrates a wellsite system 100 with which embodiments of two dimensional pixel-based inversion method can be employed. Wellsite system 100 can be an onshore wellsite or offshore wellsite. In this case, the wellsite system 100 is located at an onshore wellsite. In this example wellsite system, a borehole 102 is formed in a subsurface formation by rotary drilling in a manner that is well known. Embodiments of two dimensional pixel-based inversion can also be employed in association with wellsite systems to perform directional drilling.

The wellsite system 100 includes a drill string 104 that can be suspended within borehole 102. The drill string 104 includes a bottom-hole assembly 106 with a drill bit 108 at its lower end. The system 100 can include a platform and derrick assembly 110 positioned over the borehole 102. The assembly 110 can include a rotary table 112, kelly 114, hook 116 and rotary swivel 118. The drill string 104 can be rotated by the rotary table 112, energized by means not shown, which engages kelly 114 at an upper end of drill string 104. Drill string 104 can be suspended from hook 116, attached to a traveling block (also not shown), through kelly 114 and a rotary swivel 118 which can permit rotation of drill string 104 relative to hook 116. As is well known, a top drive system can also be used.

In the example of this embodiment, drilling fluid or mud 120 is stored in a pit 122 formed at the wellsite. A pump 124 can deliver drilling fluid 120 to an interior of drill string 104 via a port in swivel 118, causing drilling fluid 120 to flow downwardly through drill string 104 as indicated by directional arrow 126. Drilling fluid 120 can exit drill string 104 via ports in drill bit 108, and circulate upwardly through an annulus region between the outside of drill string 104 and wall of the borehole 102, as indicated by directional arrows 128. In this well-known manner, drilling fluid 120 can lubricate drill bit 108 and carry formation cuttings up to the surface as drilling fluid 120 is returned to pit 122 for recirculation.

Bottom-hole assembly 106 of the illustrated embodiment can include drill bit 108 as well as a variety of equipment 130, including a logging-while-drilling (LWD) module 132, a measuring-while-drilling (MWD) module 134, a roto-steerable system and motor.

In one possible implementation, LWD module 132 can be housed in a special type of drill collar, as is known in the art, and can include one or more of a plurality of known types of logging tools (e.g., an electromagnetic logging tool, a nuclear magnetic resonance (NMR) tool, and/or a sonic logging tool). It will also be understood that more than one LWD and/or MWD module can be employed (e.g., as represented at position 136). (References, throughout, to a module at position 132 can also mean a module at position 136 as well). LWD module 132 can include capabilities for measuring, processing, and storing information, as well as for communicating with surface equipment.

MWD module 134 can also be housed in a special type of drill collar, as is known in the art, and include one or more devices for measuring characteristics of the well environment, such as characteristics of the drill string and drill bit. MWD module 134 can further include an apparatus (not shown) for generating electrical power to the downhole system. This may include a mud turbine generator powered by the flow of drilling fluid 120, it being understood that other power and/or battery systems may be employed. MWD module 134 can include one or more of a variety of measuring devices known in the art (e.g., a weight-on-bit measuring device, a torque measuring device, a vibration measuring device, a shock measuring device, a stick slip measuring device, a direction measuring device, and an inclination measuring device).

MWD tools in MWD module 134, and LWD tools in LWD module 132 can include one or more characteristics common to wireline tools (e.g., transmitting and receiving antennas, sensors, etc.), with MWD and LWD tools being designed and constructed to endure and operate in the harsh environment of drilling.

Various systems and methods can be used to transmit information (data and/or commands) from equipment 130 to a surface 138 of the wellsite. In one implementation, information can be received by one or more sensors 140. The sensors 140 can be located in a variety of locations and can be chosen from any sensing and/or detecting technology known in the art, including those capable of measuring various types of radiation, electric or magnetic fields, including electrodes (such as stakes), magnetometers, coils, etc.

In one possible implementation, information from equipment 130, including LWD data and/or MWD data, can be utilized for a variety of purposes including steering drill bit 108 and any tools associated therewith, characterizing a formation 142 surrounding borehole 102, characterizing fluids within borehole 102, etc. For example, information from equipment 130 can be used to create one or more sub-images of various portions of borehole 102.

In one implementation a logging and control system 144 can be present. Logging and control system 144 can receive and process a variety of information from a variety of sources, including equipment 130. Logging and control system 144 can also control a variety of equipment, such as equipment 130 and drill bit 108.

Logging and control system 144 can also be used with a wide variety of oilfield applications, including logging while drilling, artificial lift, measuring while drilling, wireline, etc., and can include one or more processor-based computing systems. In the present context, a processor may include a microprocessor, programmable logic devices (PLDs), field-gate programmable arrays (FPGAs), application-specific integrated circuits (ASICs), system-on-a-chip processors (SoCs), or any other suitable integrated circuit capable of executing encoded instructions stored, for example, on tangible computer-readable media (e.g., read-only memory, random access memory, a hard drive, optical disk, flash memory, etc.). Such instructions may correspond to, for instance, workflows and the like for carrying out a drilling operation, algorithms and routines for processing data received at the surface from equipment 130, and so on.

Logging and control system 144 can be located at surface 138, below surface 138, proximate to borehole 102, remote from borehole 102, or any combination thereof. For example, in one possible implementation, information received by equipment 130 and/or sensors 140 can be processed by logging and control system 144 at one or more locations, including any configuration known in the art, such as in one or more handheld devices proximate and/or remote from wellsite 100, at a computer located at a remote command center, a computer located at wellsite 100, etc.

In one aspect, logging and control system 144 can be used to create images of borehole 102 and/or formation 142 from information received from equipment 130 and/or from various other tools, including wireline tools. In one possible implementation, logging and control system 144 can also perform various aspects of the two dimensional pixel-based inversion method to perform an inversion to obtain one or more desired formation parameters. Logging and control system 144 can also use information obtained from the two dimensional pixel-based inversion to perform a variety of operations including, for example, steering drill bit 108 through formation 142, with or without the help of a user.

FIG. 1 shows an example of wellsite drilling system 100. However, embodiments of the two dimensional pixel-based inversion method are not limited to drilling systems. For example, various embodiments of the two dimensional pixel-based inversion method can be implemented with wireline systems.

Example Processing System

Figure 2:
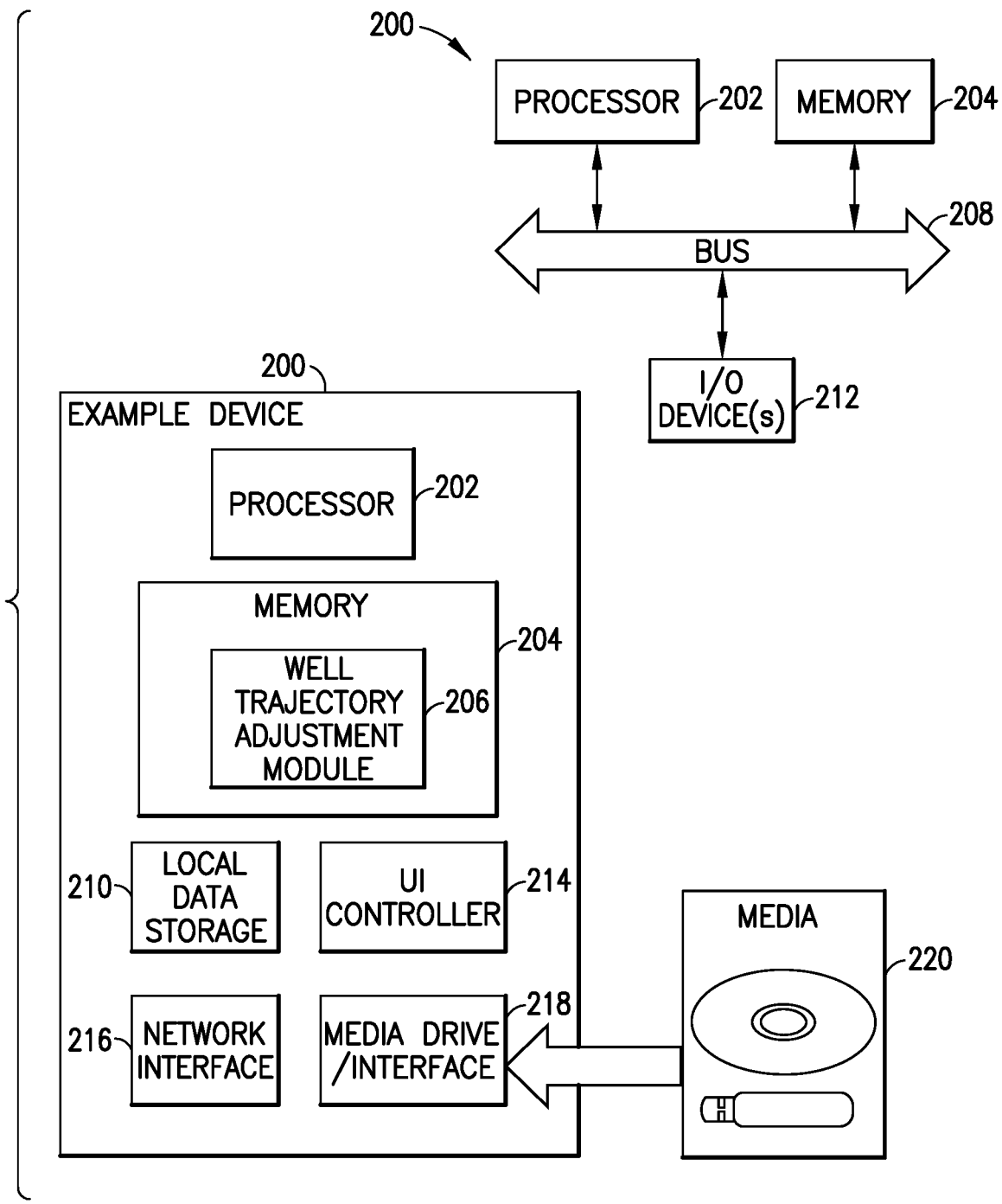
FIG. 2 illustrates an example processing system which can be used in conjunction with various embodiments of two dimensional pixel-based inversion.

FIG. 2 illustrates an example processing system 200, with a processor 202 and memory 204 for hosting a two dimensional pixel-based inversion module 206 configured to implement various embodiments of two dimensional pixel-based inversion as discussed in this disclosure. Memory 204 can also host one or more databases and can include one or more forms of volatile data storage media such as random access memory (RAM), and/or one or more forms of non-volatile storage media (such as read-only memory (ROM), flash memory, and so forth).

Processing system 200 is one example of a computing system or programmable system, and is not intended to suggest any limitation as to scope of use or functionality of processing system 200 and/or its possible architectures. For example, processing system 200 can comprise one or more desktop computers, programmable logic controllers (PLCs), laptop computers, handheld devices, mainframe computers, etc., including any combination thereof.

Further, processing system 200 should not be interpreted as having any dependency relating to one or a combination of components illustrated in processing system 200. For example, processing system 200 may include one or more of a computer, such as a laptop computer, a desktop computer, a mainframe computer, etc., or any combination or accumulation thereof.

Processing system 200 can also include a bus 208 configured to allow various components and devices, such as processors 202, memory 204, and local data storage 210, among other components, to communicate with each other.

Bus 208 can include one or more of any of several types of bus structures, including a memory bus or memory controller, a peripheral bus, an accelerated graphics port, and a processor or local bus using any of a variety of bus architectures. Bus 208 can also include wired and/or wireless buses.

Local data storage 210 can include fixed media (e.g., RAM, ROM, a fixed hard drive, etc.) as well as removable media (e.g., a flash memory drive, a removable hard drive, optical disks, magnetic disks, and so forth).

One or more input/output (I/O) device(s) 212 may also communicate via a user interface (UI) controller 214, which may connect with I/O device(s) 212 either directly or through bus 208.

In one possible implementation, a network interface 216 may communicate outside of processing system 200 via a connected network, and in some implementations may communicate with hardware.

A media drive/interface 218 can accept removable tangible media 220, such as flash drives, optical disks, removable hard drives, software products, etc. In one possible implementation, logic, computing instructions, and/or software programs comprising elements of two dimensional pixel-based inversion module 206 may reside on removable media 220 readable by media drive/interface 218.

In one possible embodiment, input/output device(s) 212 can allow a user to enter commands and information to processing system 200, and also allow information to be presented to the user and/or other components or devices. Examples of input device(s) 212 include, for example, sensors, a keyboard, a cursor control device (e.g., a mouse), a microphone, a scanner, and any other input devices known in the art. Examples of output devices include a display device (e.g., a monitor or projector), speakers, a printer, a network card, and so on.

Various processes of two dimensional pixel-based inversion module 206 may be described herein in the general context of software or program modules, or the module may be implemented in pure computing hardware. Software generally includes routines, programs, objects, components, data structures, and so forth that perform particular tasks or implement particular data types. An implementation of these modules and techniques may be stored on or transmitted across some form of tangible computer-readable media. Computer-readable media can be any available data storage medium or media that is tangible and can be accessed by a computing device. Computer readable media may thus comprise computer storage media. "Computer storage media" designates non-transitory tangible media, and includes volatile and non-volatile, removable and non-removable tangible media implemented for storage of information such as computer readable instructions, data structures, program modules, or other data. Computer storage media include, but are not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other tangible medium which can be used to store the desired information, and which can be accessed by a computer.

In one possible implementation, processing system 200, or a plurality thereof, can be employed with the wellsite system 100. This can include, for example, in various equipment 130, in logging and control system 144, etc.

Example Tools

Figure 3:
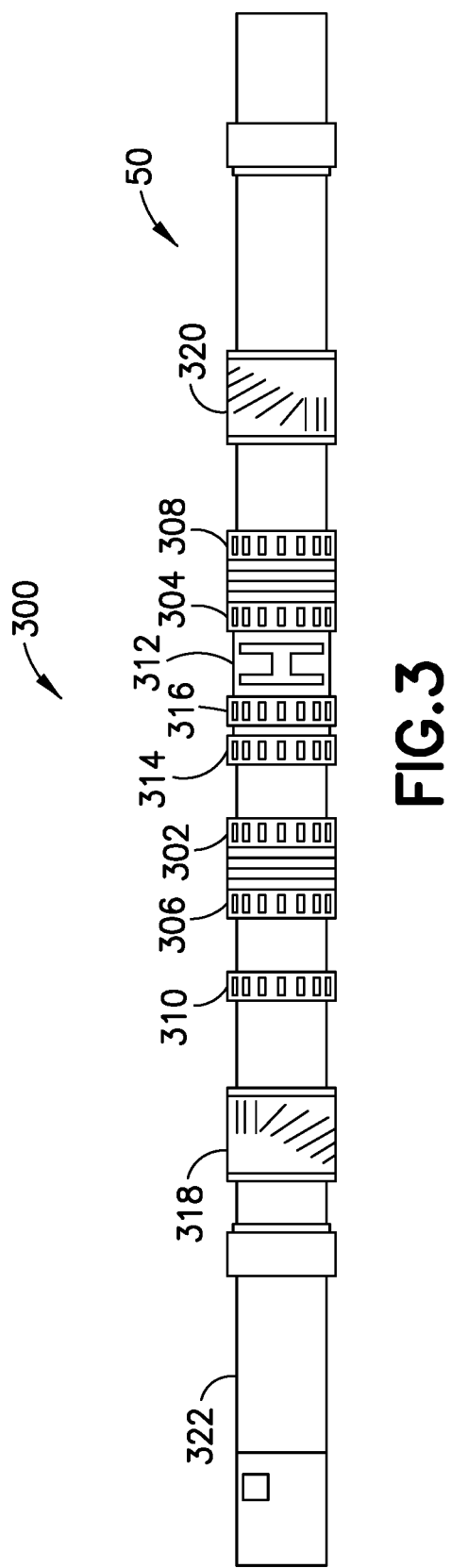
FIG. 3 illustrates an example logging tool that can be used in conjunction with various embodiments of two dimensional pixel-based inversion.

FIG. 3 illustrates an example electromagnetic logging tool 300 that can be used in conjunction with various embodiments of the two dimensional pixel-based inversion method. The electromagnetic logging tool 300 can be deployed in borehole 102, including high angle and/or horizontal wells (HA/HZ), vertical wells, deviated wells, etc. The electromagnetic logging tool can be deployed as part of an LWD module 132, as part of an MWD module, and/or as part of a wireline tool (e.g., a triaxial induction tool with one or more orthogonal sets of antennas such as the RtScanner™ of Schlumberger Technology Corporation). The electromagnetic logging tool 300 includes electromagnetic coupling components that can be used to determine characteristics of formation 142.

In one possible implementation, electromagnetic logging tool 300 may be a multi-spacing directional electromagnetic propagation tool. Directional electromagnetic propagation tools are also know in the art as "directional resistivity tools" or "deep directional resistivity tool." In one possible aspect, the electromagnetic logging tool 300 may be capable of making measurements at multiple frequencies, such as at 100 kHz, 400 kHz, 2 MHz, etc. As illustrated, the electromagnetic logging tool 300 includes multiple transmitters 302, 304, 306, 308, 310 and 312 and multiple receivers 314, 316, 318, and 320 spaced axially along a body 322 of logging tool 300. In the depicted example, electromagnetic logging tool 300 includes axial, transverse, and tilted antennas. Axial antennas can include dipole moments substantially parallel with a longitudinal axis of logging tool 300, such as, for example, as shown at transmitter 304. Axial antennas are commonly wound about the circumference of a logging tool such that the plane of the antenna is orthogonal to the tool axis. Axial antennas produce a radiation pattern that is equivalent to a dipole along the axis of the tool (by convention the z-direction). Electromagnetic measurements made by axially oriented antennas may be referred to as conventional or non-directional measurements.

A transverse antenna is one whose dipole moment is substantially perpendicular to the longitudinal axis of a logging tool, such as, for example, transmitter 312. A transverse antenna may include a saddle coil and generate a radiation pattern that is equivalent to a dipole that is perpendicular to the axis of the tool (by convention the x or y direction). A tilted antenna is one whose dipole moment is neither parallel nor perpendicular to the longitudinal axis of a logging tool, such as, for example, receivers 318 and 320. Tilted antennas generate a mixed mode radiation pattern (i.e., a radiation pattern in which the dipole moment is neither parallel nor perpendicular with the tool axis). Electromagnetic measurements made by transverse or tilted antennas may be referred to as directional measurements.

As illustrated in FIG. 3, five of the transmitter antennas 302, 304, 306, 308 and 310 are axial antennas spaced along the axis of logging tool 300. A sixth transmitter antenna (312) is a transverse antenna. First and second receivers (314 and 316) located axially between the transmitters are axial antennas and may be used to obtain conventional non-directional type propagation resistivity measurements. Third and fourth receivers (318 and 320) are tilted antennas located axially about the transmitters. Such a directional arrangement (including tilted and/or transverse antennas) produces a sensitivity on one azimuthal side of logging tool 300 that better enables bed boundaries and other features of the subterranean formations to be identified and located.

Accordingly, as the electromagnetic logging tool 300 in FIG. 3 provides both axial transmitters and axial receiver pairs as well as axial transmitter and tilted receiver pairs, the electromagnetic logging tool 300 is capable of making both directional and non-directional electromagnetic measurements. Further, the electromagnetic logging tool 300 illustrated in FIG. 3 can be capable of providing symmetrized and anti-symmetrized measurements (up and down measurements) with the same antenna spacings. As an example, in one particular embodiment, electromagnetic logging tool 300 may be capable of making measurements using transmitter-receiver pairs with spacings of, for example, 22, 34, 84, and 96 inches.

The electromagnetic logging tool 300 is not limited to the example provided in FIG. 3. The electromagnetic logging may include any configuration known in the art. For example, the electromagnetic logging tool 300 can have one or more transmitting antennas on a first modular sub and one or more receiver antennas on a second modular sub. The subs including the transmitting and receiving antennas may be distributed at different locations along drill string 104. As an illustrative example, in one possible embodiment, one sub (could be transmitter or receiver) may include multiple antennas having tilted dipole moments. The antennas, in one embodiment, may include three antennas with substantially equal angle tilts, but rotated 120 degrees apart azimuthally. In other embodiments, a given sub may include a set of multi-axial collocated antennas, such a tri-axial collocated antenna array having three antennas, each having dipole moments that are orthogonal with respect to the other two. In such modular tool embodiments, transmitter-receiver spacings of greater distances compared to those found on the logging tool 300 of FIG. 3 can be achieved. For example, in some embodiments, transmitter-receiver spacings of 10 feet or more, 30 feet or more, 60 feet or more, and even 100 feet or more may be achieved, providing for deep directional electromagnetic measurements.

Example Methods

Illustrative embodiments of the 2D pixel-based inversion method described herein can be used to process subsurface measurement data, such as electromagnetic data collected using electromagnetic logging tool 300, to determine various parameters of interest. The 2D pixel-based inversion method uses a process known as an "inversion". In general, inversion processing includes making an initial estimate or model of the geometry and properties of the earth formations, such as formation 142, surrounding electromagnetic logging tool 300. The initial model parameters may be derived in various ways known in the art and an expected response expected to be measured by logging tool 300 can be calculated based on the initial model of formation 142 and/or borehole 102. This calculated response can then be compared to an actual response measured by logging tool 300. Differences between the calculated response and the actual response can then be used to adjust the parameters of the initial model to create an adjusted model of formation 142, which can then be used to calculate a second calculated response that might be expected to be measured by logging tool 300. The second calculated response can then be compared to the actual response measured by logging tool 300, and any differences between the second calculated response and the actual response can be used to again adjust the model. This process can be repeated until the differences between the calculated response and the actual response measured by logging tool 300 fall below a pre-selected threshold. In one possible implementation, inversion decreases and/or minimizes a cost function in terms of difference between the calculated response and the actual response measured by logging tool 300, sometimes referred as the error term, through adjusting the model of formation 142 and/or borehole 102, defined by geometry and various properties. By way of example, U.S. Pat. No. 6,594,584, issued on Jul. 15, 2003, and PCT Application WO 2015/134455, published on Sep. 11, 2015, describe some inversion techniques and are incorporated herein by reference in their entireties.

In one specific example, the 2D pixel-based inversion method described herein can be used for geosteering applications. More specifically, the 2D pixel-based inversion method can be performed by a logging and control system 104 as a drilling operation is performed. The 2D pixel-based inversion method is used to determine a 2D formation model based upon electromagnetic data acquired by the electromagnetic tool as the drilling operation is performed. The 2D formation model is then used to make steering decisions, such as maintaining the drilling tool within a particular formation layer or avoiding boundaries, faults, and obstacles. The logging and control system 104 can send control signals to the drilling tool to steer the drill bit 108. In this manner, the 2D pixel-based inversion method can be used to steer the drilling tool in real-time as the drilling operation is performed.

Some embodiments of the 2D pixel-based inversion methods described herein can use anti-symmetrized measurements and induction and propagation measurements to estimate formation resistivity and anisotropy at any angle independent of mud type. A minimally biased real-time interpretation approach based on pixel-based inversion is disclosed which does not assume a maximal number of layers (an assumption often present in some existing model-based inversion approaches). Instead of inverting for distance to boundary layer thicknesses, bed resistivities, and dip, aspects of the presently disclosed inversion methods invert for distribution of resistivities using predefined thin layers referred to as "pixels." The boundary positions are inferred from changes in resistivities. In one possible aspect, inversion can be performed for anisotropic resistivity distribution and dip in a 1D inversion.

In one possible implementation, the pixel distribution can be based on measurement sensitivities, and the pixel size can be derived such that the contribution of each pixel is nearly the same. As an illustrative example, using 37 to 80 pixels may enable one to resolve more than 10 layers. Moreover, since the problem can be over-determined, regularization can be applied penalizing an L1 or L2 norm of conductivity changes (the conductivity gradient and/or a function of conductivity or another transformed value). The regularization term weighting can be derived adaptively and may be based on several known approaches, such as Occam's inversion, L-curve, generalized cross-validation, etc.

The present disclosure also proposes related methods for visualization and quality control of directional resistivity measurement inversion-based interpretation. For instance, inversion output, misfits, regularization coefficient values, derived dip and formation consistency, and model covariance matrix (uncertainties), may be used. For embodiments that use Occam's inversion based interpretation, solutions for different values of regularization coefficients to evaluate uncertainties of the interpreted structure are also described herein.

In one possible implementation, a non-uniform inversion grid can be used to simplify calculations in the creation of two dimensional formation models. In one possible aspect, one such two dimensional formation model—an approximate 2D formation model of a formation—can be pursued as a superposition of local 1D formation models, tied with suitable regularization. Such an implementation can be used to facilitate, for example, real-time well placement. In another possible aspect, another type of two dimensional formation model—a full 2D formation model (such as a full 2D curtain-section formation model)—can be pursued using a full 2.5D forward model in the inversion loop.

(i) Examples of Approximate 2D Inversion

Instead of using a single 1D formation model to fit the data of an entire measurement window, in one possible implementation, approximate 2D inversion creates a 1D formation model for each data acquisition point in a measurement window and ties the 1D formation models together through regularization of various differences between them, creating an approximate 2D formation model. Pixels in the individual 1D formation models can dip with respect to a trajectory of logging tool 300 in borehole 102, and each 1D formation model can be discretized into thin non-uniform layers ("pixels") based on measurement sensitivity.

Moreover, in one possible implementation, Gauss-Newton inversion can be used to determine the resistivity and the resistivity anisotropy of each pixel by iteratively matching the responses measured by logging tool 300 to the respective 1D formation model. The adaptive gradient regularization of the horizontal resistivity ($R_h$) and the vertical resistivity ($R_v$) in both TST and $TST_p$ can be handled by, for example, Occam's method. Also, an L1-norm-like regularization can be used to ensure piecewise constant resistivity profiles. TST stands for "true stratigraphic thickess" along an axis perpendicular to formation layers (e.g., as shown in FIG. 4 (418)) and $TST_p$ is an axis perpendicular to TST (e.g., as shown in FIG. 5 (506)).

In one possible implementation, regularization is employed along the $TST_p$ direction. A reservoir map that reduces and/or minimizes the error due to 1D approximation of formation 142 can be found through a standard 1D inversion for a single station. However, such a 1D inversion can be very sensitive to noise. Regularization along the $TST_p$ direction can reduce this sensitivity to the noise while the error due to the 1D approximation of formation 142 can remain small and/or minimal.

Figure 4:
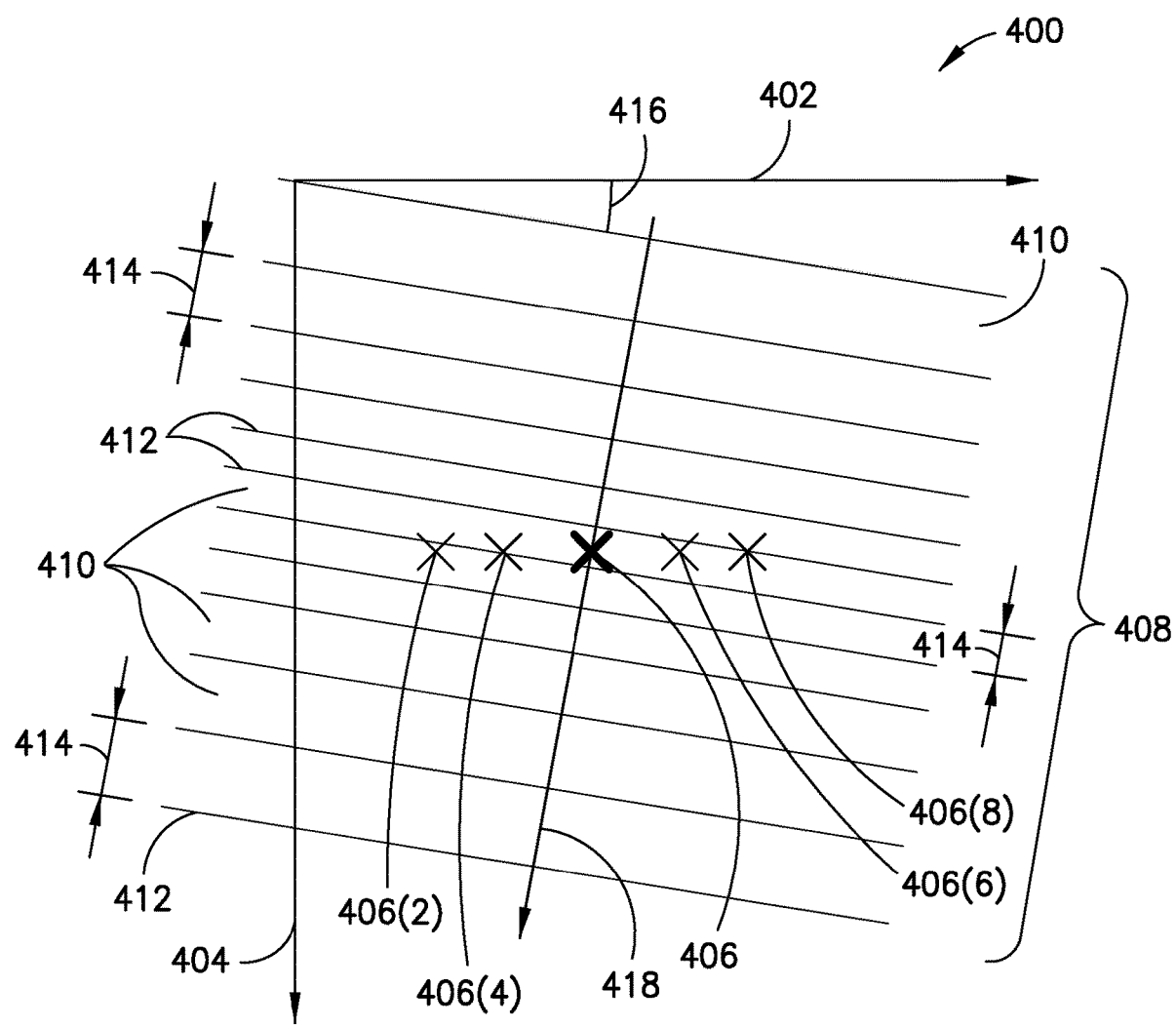
FIG. 4 illustrates an example overview of a sample 1D inversion model in accordance with various embodiments of two dimensional pixel-based inversion.
Figure 5:
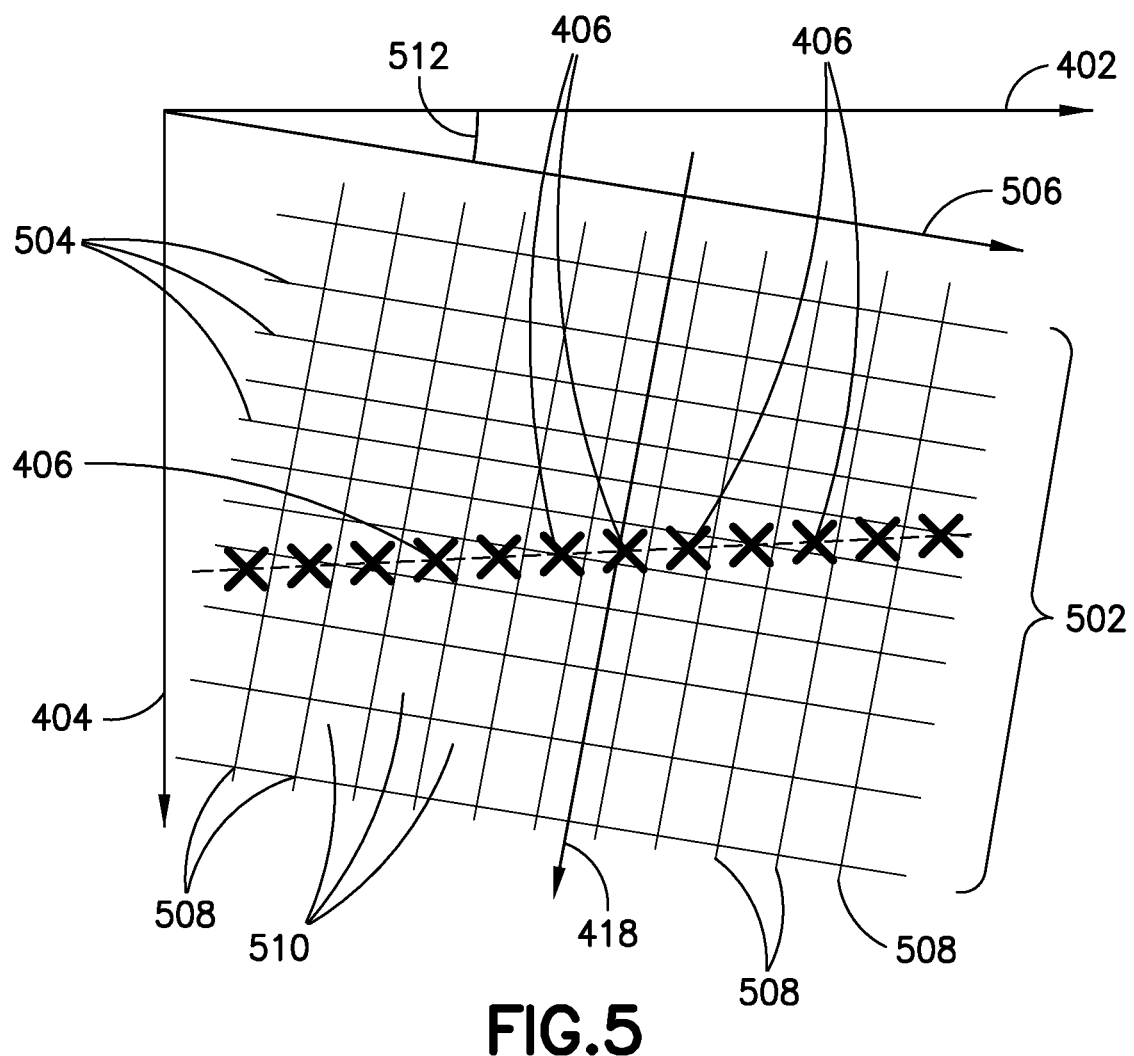
FIG. 5 illustrates an example two dimensional pixel grid in accordance with various embodiments of two dimensional pixel-based inversion.

FIG. 4 illustrates a schematic visualization 400 of a 1D formation representation mapped with reference to a true horizontal length (THL) axis 402 and a true vertical depth (TVD) axis 404 in accordance with various embodiments of an approximate 2D inversion.

In one possible implementation, measurements taken by logging tool 300 at a data acquisition point 406 in borehole 102 can be inverted to create a formation representation in the form of a one dimensional (1D) formation model 408 associated with data acquisition point 406. Stated another way, 1D formation model 408 can approximate the layers of formation 142 as a plurality of pixels 410 bounded by gridlines 412 having infinite width, and finite thicknesses 414. 1D inversion can be conducted using any other techniques known in the art, including, for example, techniques described in PCT Application WO 2015/134455, which is incorporated herein by reference in its entirety.

Pixels 410 can have varying, non-uniform thicknesses 414 or uniform thicknesses 414 (though uniform thicknesses 414 may result in slower calculation times in accordance with some implementations of two dimensional pixel-based inversion).

In one possible embodiment, the number of pixels 410 can be larger than the number of physical layers of formation 142, such that gridlines 412 may not represent boundaries of formation 142. Rather, boundaries in formation 142 can be inferred, for example, from changes in resistivity depicted in formation model 408.

In one possible implementation, 1D formation model 408 associated with data acquisition point 406 can be calculated using measurements from one or more additional data acquisition points 406(2), 406(4), 406(6), 406(8), etc., along borehole 102 adjacent to (e.g., in front of and/or behind) data acquisition point 406. In one possible aspect, using measurements from multiple additional data acquisition points 406(2), 406(4), 406(6), 406(8) can decrease noise and result in a more accurate 1D formation model 408 associated with data acquisition point 406.

For example, in one possible embodiment, measurements taken at ten or more additional data acquisition points 406 within a measurement window of, for example, 0.5 to 1 times the spacing between transmitter and receiver antenna on logging tool 300, can be used along with measurements taken at data acquisition point 406 in an inversion process. Use of additional measurements like these in the inversion process can render the inversion process more robust against noise, and increase the inversion's sensitivity to a formation relative dip 416 with respect to, for example, THL axis 402.

It will be understood that data acquisition points 406 can represent points on a trajectory of borehole 102. Moreover, in some possible implementations, since tool 300 can acquire data and measurements continuously while moving along borehole 102, some data and measurements taken away from a precise geographical location of a given data acquisition point 406 can be associated with the given data acquisition point 406. For example, in one possible aspect, data and measurements collected by tool 300 up to ten or more feet away from a given data acquisition point 406 (either before or after the given data acquisition point 406) can be associated with the given data acquisition point 406.

Measurement windows can include as many or as few data acquisition points 406 as desired. In one possible implementation, a measurement window can include twenty-one data acquisition points 406, though more or less data acquisition points 406 can also be used.

In one possible implementation, the inversion process discussed in conjunction with schematic visualization 400 can work well if the formation 142 is truly one dimensional. However, if formation 142 cannot be represented by a layered formation, using a measurement window of data acquisition points 406 in the inversion instead of a single data acquisition point 406 can lead to more artifacts in the inversion result.

In one possible implementation, instead of using a single 1D formation model 408 to fit the data of an entire measurement window, individual 1D formation models 408 can be created for each data acquisition point 406 in the measurement window and the various individual 1D formation models 408 can be tied together through regularization of the differences between them (such as in the $TST_p$ direction). Pixels 410 can dip with respect to a trajectory of logging tool 300 as it moves along borehole 102. In one possible implementation, each of the individual 1D formation models 408 can be discretized into a thin non-uniform distribution of pixels 410 based on measurement sensitivities in any way known in the art.

Minimization and/or optimization algorithms (such as for example, Gauss-Newton inversion, gradient descent, stochastic inversion, and global inversion) can be used to determine the resistivity and the resistivity anisotropy of each pixel 410 in each 1D formation model 408 by iteratively matching the tool responses measured by logging tool 300 to the 1D formation model 408. Adaptive gradient regularization of the horizontal resistivity ($R_h$) and the vertical resistivity ($R_v$) in both TST direction 418 and a $TST_p$ direction can be handled using any adaptive regularization technique known in the art, such as Occam's method, L-curve techniques, and generalized cross-validation, and a L1-norm like regularization, can be employed to ensure piecewise constant resistivity profiles.

In one possible implementation, a reservoir map of all or portions of formation 142 that minimizes the error due to 1D approximation of the formation 142 can be found through a standard 1D inversion for a single station. However, the inversion may be very sensitive to noise. In one possible aspect, regularization along the $TST_p$ direction can reduce this sensitivity to noise while keeping the error due to the 1D approximation of the formation low.

FIG. 5 illustrates an example two dimensional (2D) pixel grid 502 mapped with reference to true horizontal length (THL) axis 402 and true vertical depth (TVD) axis 404 in accordance with various embodiments of two dimensional pixel-based inversion. 2D pixel grid 502 can be made of gridlines 504 parallel to the TST direction 506, and gridlines 508 parallel to the TST direction 418 in any way known in the art. For example, in one possible implementation, spacing of gridlines 504 and 508 can be predetermined in any fashion known in the art.

For example, in one possible implementation, the spacing of gridlines 504 can result from analyzing the spacings between gridlines 412 (i.e. thicknesses 414 of pixels 410) in the various 1D formation models 408 associated with data acquisition points 406 in a measurement window. For example, an averaging/regularizing of the thicknesses 414 of the various pixels 410 across the various 1D formation models 408 associated with the measurement window can be used to create the spacings between gridlines 504.

Thus the spacings between gridlines 504 can be nonuniform throughout 2D pixel grid 502, though in some implementations it may be desirable to make the spacings between gridlines 504 uniform throughout 2D pixel grid 502.

The spacing of gridlines 508 can be nonuniform or uniform throughout 2D pixel grid 502 as desired. For example, in one possible implementation the spacing between gridlines 508 can correspond to the spacing between the individual data acquisition points 406 in the measurement window. In one possible implementation, spacing of gridlines 508 can be associated with a signal strength and measurement depth of investigation of logging tool 300. For example, if logging tool 300 is capable of making measurements deep into formation 142, less data acquisition points 406 per unit distance along borehole 102 may be desired than if logging tool 300 is incapable of making measurements as deep into formation 142. In one possible implementation, distances between data acquisition points 406 (and thus distances between gridlines 508) can be between 0.5 and 1.0 meter, though greater and lesser distances can also be employed.

In one possible implementation, spacings between gridlines 504 and/or spacings between gridlines 508 can be set to create the largest possible grid sizing capable of achieving a desired resolution in 2D pixel grid 502 (including a minimum desired resolution) and/or in a resulting approximate 2D formation model to be made from 2D pixel grid 502.

As illustrated in FIG. 5, pixels 510 in 2D pixel grid 502 do not have infinite width, but rather are bounded by gridlines 504 and gridlines 508. Moreover, as illustrated in FIG. 5, 2D pixel grid 502 can be offset (rotated) from the THL-TVD axes by a dip 512. In one possible aspect, dip 512 can be calculated by averaging dips relative to the THL-TVD axes of the one or more of the 1D formation models 408 used to create 2D pixel grid 502. Any averaging technique known in the art can be used in such calculations including, for example, weighted averaging.

For instance, the weights for dip averaging can be the inverse of the data fit term:

$$½\Sigma_k w_k^2 (d_k^{obs} f_k(x))^2 \quad \text{(a)}$$

of the 1D formation models 408. The data fit term sums the square of the weighted differences between the measurement (observed) data $(d_k^{obs})$ and modeled formation responses $f_k(x)$, Once calculated, dip 512 can be fixed and not inverted.

In one possible implementation, once the 2D pixel grid 502 has been formulated, it can be populated with information from the various 1D formation models used in its construction.

Figure 6:
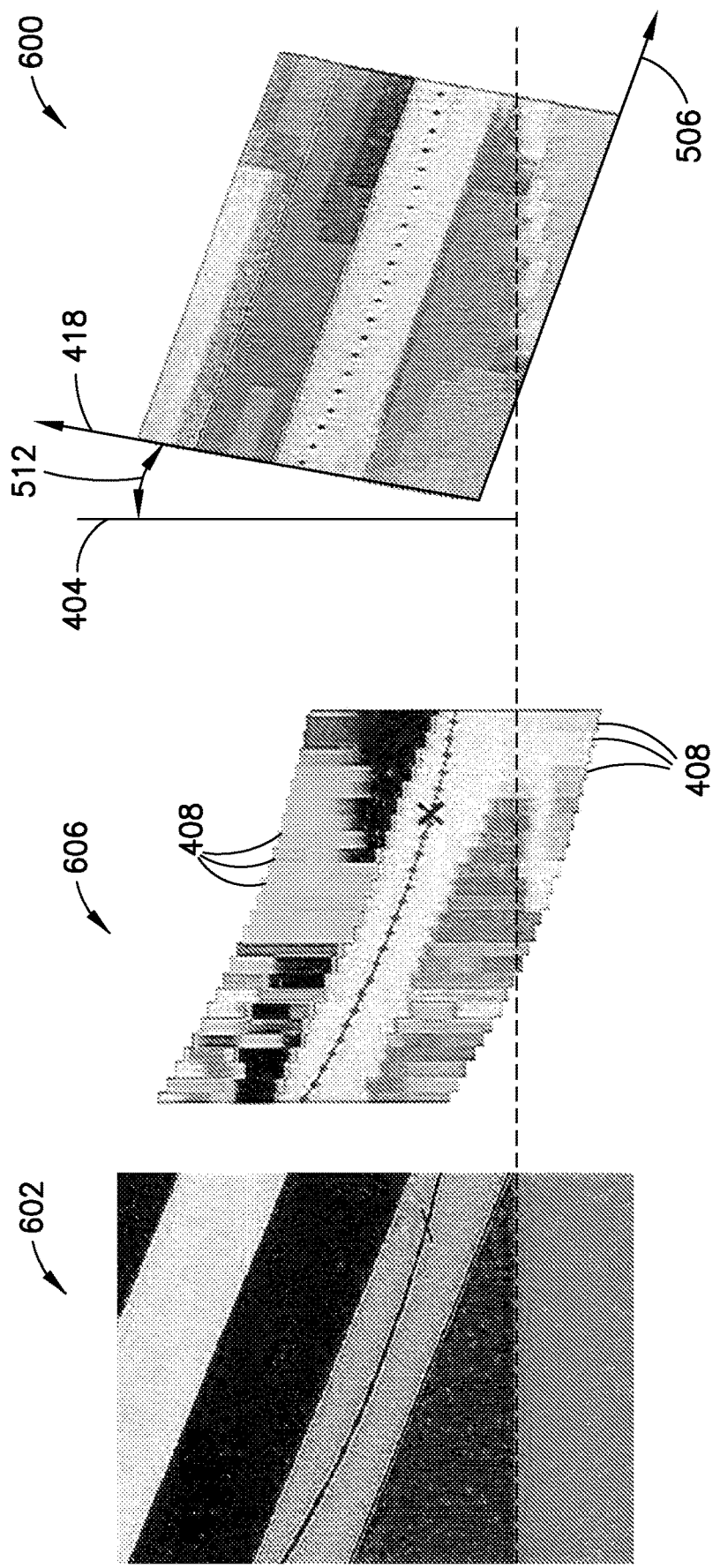
FIG. 6 illustrates an example 2D formation model in accordance with various embodiments of approximate 2D pixel-based inversion.

FIG. 6 illustrates an example approximate 2D formation model 600 in accordance with various embodiments of two dimensional pixel-based inversion. Approximate 2D formation model 600 can model an actual portion 602 of formation 142 by using a plurality of 1D formation models 408 in a curtain section model 606. In the instant example, 27 1D formation models 408 (corresponding to a measurement window of 27 data acquisition points 406) have been used to create curtain section model 606. Measurement windows with more or less 1D formation models 408 could also be used to create curtain section model 606.

In one possible implementation, information from the 1D formation models 408 in curtain section model 606 can be used to populate 2D pixel grid 502. For example, 2D pixel grid 502 can be created with 21 pixels in the perpendicular to true stratographic thickness $(TST_p)$ direction 506, which are 2 feet apart, and 36 non-uniform pixels in the true stratographic thickness (TST) direction 418. These are examples, however, and it will be understood that other pixel values can also be used to create 2D pixel grid 502.

Once 2D pixel grid 502 is created, it can be populated to form a populated 2D pixel grid 502. For example, in one possible implementation, a pixel 510 having a distinct address on the THL-TVD axis can be populated with a pixel value (such as one or more resistivity values, anisotropy values, etc.) found in a portion of a 1D formation model 408 at the same distinct address on the THL-TVD axis in curtain section model 606. Such a procedure can be followed for each pixel 510 in 2D pixel grid 502 such that all of pixels 510 are populated with pixel information from the various 1D formation models 408 used to create curtain section model 606.

In one possible implementation, horizontal resistance $(R_h)$ and vertical resistance $(R_v)$ values from curtain section model 606 can serve as an initial guess in calculating approximate 2D formation model 600.

In one possible implementation, it may not be practical to choose too many pixels along the $TST_p$ direction 506, otherwise an assumption that the layering within approximate 2D formation model 600 approximately follows the direction of dip 512 may become invalid. Thus any of various numbers of pixels 510 (and distances between pixels 510) can be chosen to make up each 2D formation model 600. In one possible embodiment, the number of pixels 510, and the distance between them can be chosen based on the signal strength and/or depth of investigation of the electromagnetic logging tool 300 being used. For example, in one possible aspect, 21 pixels 510 using measured depth (MD) data acquisition points 406 spaced 2 feet apart can be used. In another possible aspect, 21 pixels 510 using MD data acquisition points spaced 4 feet apart can be used. If it is desired to process a longer interval of data, in one possible implementation, multiple individual approximate 2D formation models 600 can be launched and blended.

After the 2D pixel grid 502 is populated with corresponding information from the various 1D formation models to form a populated 2D pixel grid, 2D pixel inversion can be used to transform the populated 2D pixel grid into approximate 2D formation model 600. In one possible aspect, a cost function can be generated for the populated two dimensional pixel grid and used in the 2D pixel inversion.

In one possible implementation, inversion minimizes a cost function in terms of difference between a modeled response of tool 300 and actual measurements acquired by tool 300, sometimes referred as the error term, through adjusting the model of the formation, defined by geometry and properties.

The cost function may be augmented with an additional regularization term and the balance between the error and the pixel regularization can be determined heuristically (see e.g., Dennis et al., "Numerical Methods for Unconstrained Optimization and Non-Linear Equations," SIAM Classics in Applied Mathematics (1996); Nocedel et al., "Numerical Optimization," $2^{nd}$ ed. Springer Series in Operations Research (2006)) or managed by adaptive regularization methods (see e.g., Constable et al., "Occam's Inversion: A Practical Algorithm for Generating Smooth Models from Electromagnetic Sounding Data," Geophysics, vol. 52, no. 3, pp. 289-300 (1987); Farquharson et al., "A Comparison of Automatic Techniques for Estimating the Regularization Parameter in Non-Linear Inverse Problem," Geophys. J. Int. 156, pp. 411-425 (2004)). In 1D inversion, the forward modeling code used may be a standard semi-analytical algorithm which computes the response of point dipoles in a layered anisotropic 1D medium.

In operation, 2D pixel inversion differs from 1D inversion in that the $R_h$ and $R_v$ differences between pixels 510 can be penalized in two directions, compared to a single penalization along the TST-direction 418 for pixels used in original 1D pixel-based inversion. Pixel penalization along the perpendicular direction TST 506 can be independent of pixel penalization along TST direction 418. In one possible implementation, the 2D pixel inversion method can be done without use of total variation regularization. Additionally, the 2D pixel inversion method can use the Huber error term φ(y):

$$\varphi(y) = \begin{cases} y^2 & |y| \le \Delta \\ 2\delta(|y| - 0.5\Delta) & |y| > \Delta \end{cases},$$

and the approximate L1-norm regularization, as in 1D pixel inversion. In addition, the inversion error term weights $w_k$ in 2D pixel inversion can be the same as in 1D inversion. Moreover, compared to the 1D pixel inversion cost function (not showing the total variation regularization):

$$C(x) = \frac{1}{2}\sum_k w_k^2 (d_k^{obs} - f_k(x))^2 + \frac{1}{2}\lambda_{TST} \sum_i \sqrt{(w_{TST,i} \cdot (x_i - x_{i-1}))^2 + c^2},$$

the 2D pixel inversion cost function can have one extra term corresponding to $TST_p$ direction 506 as follows:

$$C(x) = \frac{1}{2}\sum_k w_k^2 (d_k^{obs} - f_k(x))^2 + \frac{1}{2}\lambda_{TST} \sum_i \sqrt{(w_{TST,i} \cdot (x_i - x_{i-1}))^2 + c^2} + \frac{1}{2}\lambda_{TSTp} \sum_i \sqrt{(w_{TSTp,i} \cdot (x_i - x_{i-N}))^2 + c^2}$$

The first cost function term is the data error term, with weighted (by $w_k$) differences between the measurement (observed) data ($d_k^{obs}$) and modeled responses $f_k(x)$, the second is the pixel difference regularization along the TST direction 418 and the third term is the pixel difference regularization along the $TST_p$ direction 506 perpendicular to TST direction 418. The pixel difference regularizations sum up the approximated absolute value of the weighted (by $w_{TST}$ or $w_{TSTp}$) differences in value between pixels $x_i$ and or $x_{i-N}$. The absolute value is approximated with $f(x)=\sqrt{x^2+c^2}$ using c<<x. The constants $\lambda_{TST}$ and $\lambda_{TSTp}$ balance the two regularization terms against the data error term. In one possible implementation, $\lambda_{TST}$ and $\Delta_{TSTp}$ can balance the two regularization terms against the residual and can be estimated using any adaptive regularization technique known in the art, including for example, Occam's method, L-curve techniques, generalized cross-validation, etc. In each iteration, the Gauss-Newton step (as a function of $\lambda_{TST}$ and $\lambda_{TSTp}$) that reduces the residual the most can be found.

Figure 7:
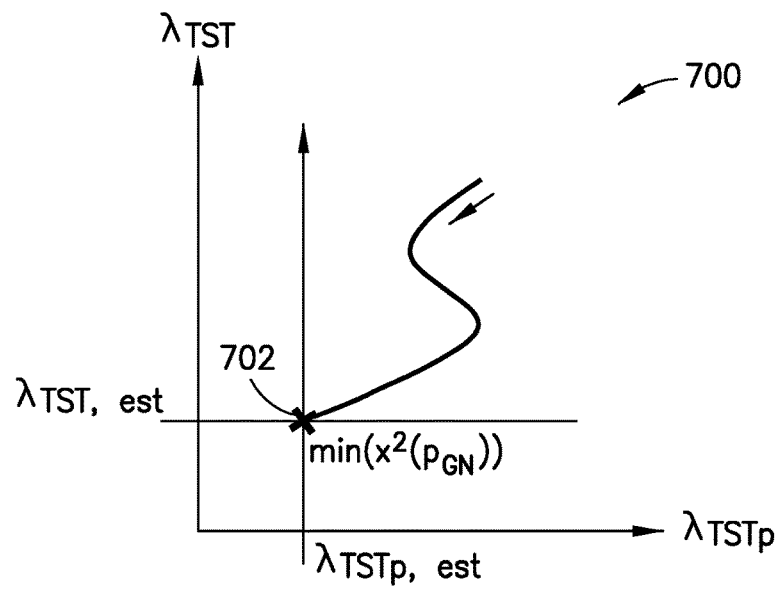
FIG. 7 illustrates an example visualization of Occam's method to estimate gradient penalization constants in accordance with various embodiments of two dimensional pixel-based inversion.

FIG. 7 illustrates a visualization 700 of Occam's method to estimate gradient penalization constraints in accordance with various embodiments of two dimensional pixel-based inversion. In one possible implementation, a search can be implemented in an efficient way to save computational time by starting from ($\lambda_{TST}$, $\lambda_{TSTp}$) of the previous iteration. A line-search can be used, adjusting $\lambda_{TST}$, new=$c_1$*$\lambda_{TST}$ and $\lambda_{TSTp}$, new=$c_2$*$\lambda_{TSTp}$ iteratively. A search direction for the minimum can be $c_1$=$c_2$=⅔ (or 3/2) and when a minimum is found in this direction, the search can continue in the perpendicular direction $c_1$=3/2 and $c_2$=⅔ (or $c_1$=⅔ and $c_2$=3/2). This can be iterated until the minimum 702 is found. In one possible aspect, a starting point for the first Occam search can be $\lambda_{TSTp}$=1.0 and $\lambda_{TST}$=0.1. If the first Occam search can't find a Gauss-Newton step that reduces the minimum $\lambda_{TST}$=5*10-5 then $\lambda_{TSTp}$=10-3 can be chosen. During the inversion, $\lambda_{TSTp}$>$\lambda_{TST}$ can be enforced to ensure lateral consistency. In one possible implementation, a 2D Occam search as described above can lead to an average of approximately ten forward model calls per inversion iteration.

In one possible embodiment, for each inversion iteration in 2D pixel inversion, calculation of the first derivatives of the measurement response with respect to pixel resistivities can be desirable. This can be achieved, for example, through finite differences by perturbing each pixel 510 separately and calculating the measurement response of the modelled formation (using, for example, a forward model of the formation) with the perturbed pixel 510. However, in one possible aspect the forward model can be called for the data acquisition point 406 of the pixel column (i.e. pixels 510 stacked in TST direction 418) to which the perturbed pixel 510 belongs in order to get a difference in the forward modeled response.

By definition of the approximate 2D forward model, in one possible implementation, the response at the data acquisition points 406 is well approximated by the 1D formation models corresponding to individual pixel columns. In other words, the response of each pixel column is independent of the response of the other columns. Hence a minimum penalization along THL direction 402 can be enforced so that lateral consistency across pixel columns is ensured. This can be achieved, for example, by enforcing $\lambda_{TSTp}$>$\lambda_{TST}$. In one possible embodiment, it is possible to compute the derivatives using the adjoint variable technique in the forward modeling used in an inversion loop.

In one possible implementation, a full 2D inversion, using 2.5D forward modeling in the inversion loop can compute Jacobian (sensitivities) using the adjoint variable technique.

Figure 8:
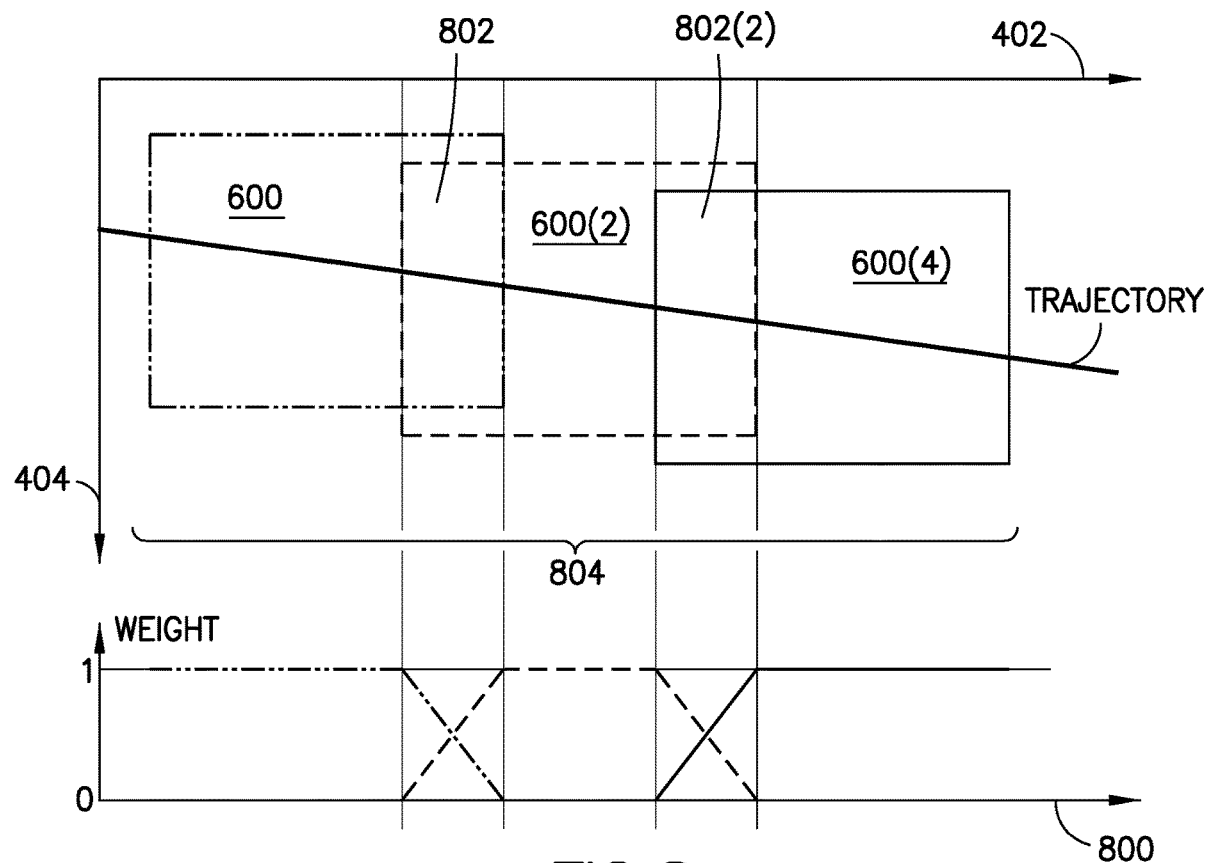
FIG. 8 illustrates blending of a plurality of approximate 2D formation models in accordance with various embodiments of two dimensional pixel-based inversion.

FIG. 8 illustrates the blending of a plurality of approximate 2D formation models 600, 600(2), 600(4) in accordance with various embodiments of two dimensional pixel-based inversion. In one possible aspect, approximate 2D formation models 600, 600(2), 600(4) are projected onto the THL-TVD plane formed by THL axis 402 and TVD axis 404 such that domains of contiguous approximate 2D formation models 600, 600(2), 600(4) can overlap in overlap regions 802, 802(2). The portions of approximate 2D formation models 600, 600(2), 600(4) in the overlap regions 802, 802(2) can be blended such that a smooth and continuous composite approximate two dimensional (2D) formation model 804 can be generated. Blending can be performed using, for example, linear horizontal distance based weighted averaging of approximate 2D formation models 600, 600(2), 600(4) in overlap regions 802, 802(2). Also, even though three approximate 2D formation models 600, 600(2), 600(4) are illustrated in FIG. 8, it will be understood that more or fewer approximate 2D formation models can be used to create composite approximate 2D formation model 804.

In one possible implementation, if approximate 2D inversion and full 2D inversion are desired, 1D formation models 408 can be used to form a starting point. For example, for multi-depth investigation of deep directional resistivity, a formation model can be built by first inverting short spacing data using multiple initial guesses, and then using short spacing and long spacing responses jointly to build the formation model consistent with any data used.

(ii) Examples of Full 2D Inversion

In one possible implementation, the techniques of approximate 2D inversion discussed herein may be desirable in modeling areas of formation 142 with one or more unconformities through deployment of approximate 2D tool response modeling. Similarly, the techniques of full 2D inversion disclosed herein may be desirable in modelling areas of formation 142 with one or more two dimensional (2D) formation features (such as, for example, a fault, etc.) through deployment of full 2D tool response modeling. In one possible aspect, a two dimensional feature can include any instance in which boundaries of formation 142 are at angle to one another of 15 degrees or more.

Since the process of full 2D inversion may be associated with more intensive use of computing resources than the process of approximate 2D inversion, some operators may as a default attempt approximate 2D inversion first. If the results of approximate 2D inversion are insufficient and/or undesirable, full 2D inversion may then be attempted.

Figure 9:
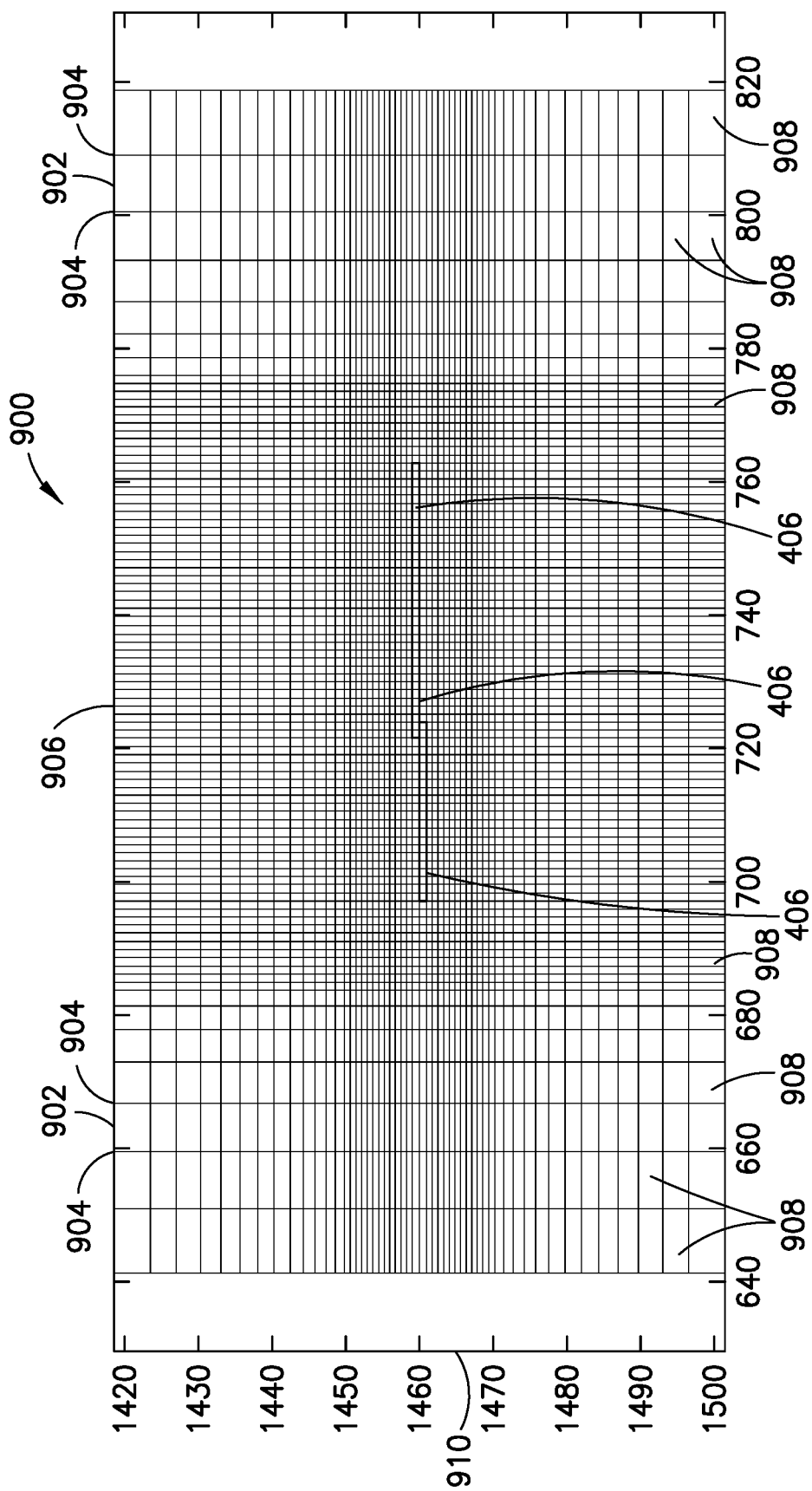
FIG. 9 illustrates an example full 2D pixel inversion domain associated with various embodiments of two dimensional pixel-based inversion.

FIG. 9 illustrates an example full 2D pixel inversion domain forming a two dimensional (2D) resistivity inversion pixel grid 900 in accordance with various embodiments of two dimensional pixel-based inversion. In the instant case, 2D resistivity inversion pixel grid 900 is associated with a two receiver (short and long spacing data R1R2) inversion with 54 data acquisition points 406 and an antenna spacing of 12.5 m (Tx–R1) and 25 m (Tx–R2), though other inversions with more or less data acquisition points 406, more receivers, and different antenna spacings can also be used.

In one possible implementation, it may be desirable to choose a window of data acquisition points 406 covering at least two times the longest antenna spacing on the electromagnetic logging tool 300 such that the window includes all data in which one or more transmitters 302, 304, 306, 308, 310 and 312 and receivers 314, 316, 318, and 320 cross a 2D formation feature being modelled in formation 142. In one possible embodiment, for the sake of simplicity, equally spaced pixel columns 902 formed by vertical gridlines 904 along true horizontal length (THL) axis 906 can be chosen and spaced at any desirable distance, including for example 1 m, 4 ft, etc. Any number of columns 902 can be created. In one possible implementation, at least 41 columns 902 can be created if one spacing (such as, for example, using one transmitter sub and one receiver sub) is used. In another possible implementation, 54 columns 902 including data can be formed if two spacings (such as one transmitter sub and two receiver subs and/or two transmitter subs and one receiver sub and/or two pairs of transmitter and receiver subs, etc.) are used (such as when regular spacing is used with measurement logging tool 300 with ~10 m and ~20 m Tx–Rx spacing).

In one possible implementation, for each pixel column 902, one or more data acquisition points 406 can be chosen. Pixels 908 along true vertical depth (TVD) axis 910 can cover the area from $\min(TVD_{data\ points})-2*spacing_{long}$ to $\max(TVD_{data\ points})+2*spacing_{long}$, where $spacing_{long}$ indicates a largest spacing in use. For example, a distribution of pixels 908 along TVD 910 can follow the distribution of pixels 908 in the various 1D formation models filled with additional thin pixels between $\min(TVD_{data\ points})$ and $\max(TVD_{data\ points})$. Along THL 906, pixels 908 can be equally spaced between $\min(THL_{data\ points})-0.5*spacing_{long}$ and $\max(THL_{data\ points})+0.5*spacing_{long}$.

In one possible implementation, in order to discretize the complete formation ahead and behind the processed data interval, pixel columns 902 with exponentially increasing width can be placed up to $\min(THL_{data\ points})-2.5*spacing_{long}$ and up to $\max(THL_{data\ points})+2.5*spacing_{long}$.

In one possible embodiment, 2D resistivity inversion pixel grid 900 can be implemented using the same techniques as described herein with reference to approximate 2D inversion. However, in one possible aspect, the TST and $TST_p$ axes (axes 418 and 506 in FIG. 5) can be TVD axis 910 and THL axis 906, such that the model is not rotated based on dip found from the 1D formation models 408 used to populate 2D pixel grid 900. Moreover, rather than inverting individual pixel columns (i.e. pixels 510 stacked in TST direction 418) as may be done in implementations of approximate 2D inversion, under some embodiments of full 2D inversion, multiple (including potentially all) columns 902 of 2D resistivity inversion pixel grid 900 can be inverted together (at the same time) to create a full two dimensional (2D) formation model associated with data from 2D resistivity inversion pixel grid 900.

Also, compared with the techniques used in associated with approximate 2D inversion, in full 2D inversion the response of each pixel column 902 is not independent of the response of the other columns 902, so $\lambda_{thl}$ and $\lambda_{tvd}$ correlate and the condition of $\lambda_{thl} > \lambda_{tvd}$ enforced in approximate 2D inversion may be disregarded in full 2D inversion.

In one possible aspect, it may be noticed that no appreciable relative variation between $\lambda_{thl}$ and $\lambda_{tvd}$ exists, such that most inversions settle with a penalization distribution close to $\lambda_{thl} = 3.0*\lambda_{tvd}$. Thus, in one possible implementation, $\lambda_{thl} = 3.0*\lambda_{tvd}$ can be chosen from the beginning of the full 2D inversion process, and the Occam search can be simplified, since the value for $\lambda_{tvd}$ is all that is sought. In one possible aspect, approximately six forward model calls per inversion iteration on average can be used. In addition, $\lambda_{thl} = 3.0*\lambda_{tvd}$ can ensure consistency of the inverted 2D pixel model (i.e. the full two dimensional formation model) created from 2D resistivity inversion pixel grid 900 along THL axis 906.

In one possible implementation, because of the increased runtime of the 2.5D forward model in full 2D inversion, parallelization can be used. For example, instead of computing the tool responses for all N data acquisition points 406 of the inversion data window with one forward model call, the channel responses can be calculated with N forward model calls which themselves compute one data acquisition point 406 each. This can reduce the channel response generation to almost 1/N of the time of a non-parallel channel response generation (assuming that at least N cores are available for the computation). Furthermore, responses at each frequency can be forward modeled in parallel as well, so N data acquisition points 406 with channels that use M frequencies can result in N*M forward modeling calls.

As noted above, in embodiments of 2D pixel-based inversion, a long interval of data can be processed by running multiple overlapping 2D inversions. The pixels ahead and behind the processed interval can then be removed before merging the individual solutions to create 2D formation model 600.

In many instances, it may not be necessary to process a long interval of data using full 2D inversion. For instance, if 1D formation models 408 can fit the data well but there is one measured depth (MD) interval where the residual and misfit spikes, a localized 2D feature (such as, for example, a fault) was likely crossed. Then a single 2D pixel inversion centered at the high residual/misfit interval can resolve the 2D feature and the 2D pixel inversion result blended into the 1D inversion result may be sufficient to fully explain the data.

In one possible implementation, differences between the inversion techniques used to create the 2D formation models described herein (such as, for example, approximate 2D inversion used to create approximate 2D formation models 600, 600(2), 600(4), and full 2D inversion used to create a full 2D formation model) can be seen in the forward models used in the various inversion loops used to create the 2D formation models. This can be in addition to other factors including, for example, the definition of a coordinate system, regularization, etc.

For example, in one possible aspect, forward modeling in approximate 2D inversion can employ a 1D solver, and forward modeling in full 2D inversion can employ a full 2D solver.

Example Workflows

Figure 10:
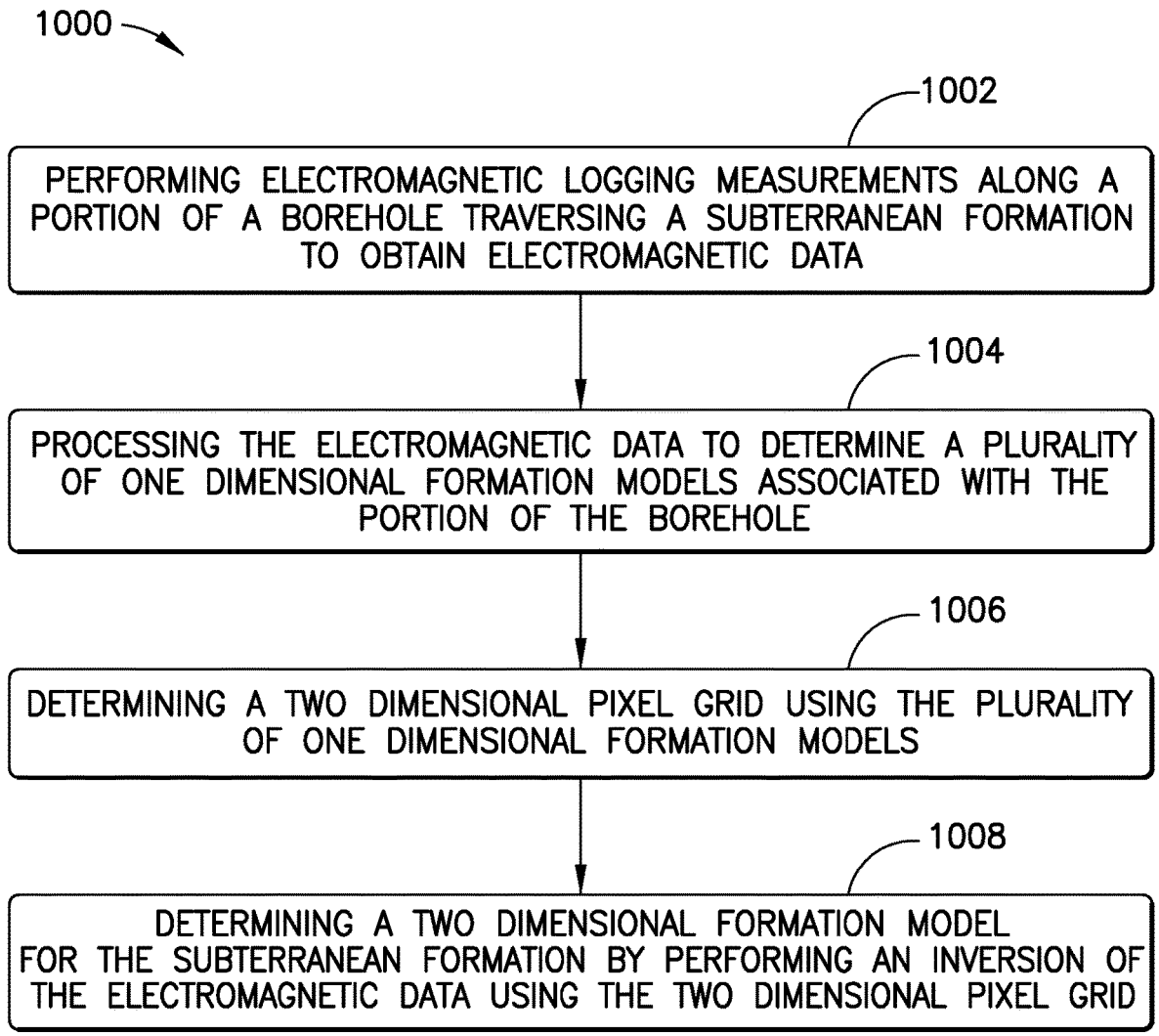
FIG. 10 illustrates an example method associated with various embodiments of two dimensional pixel-based inversion.
Figure 11:
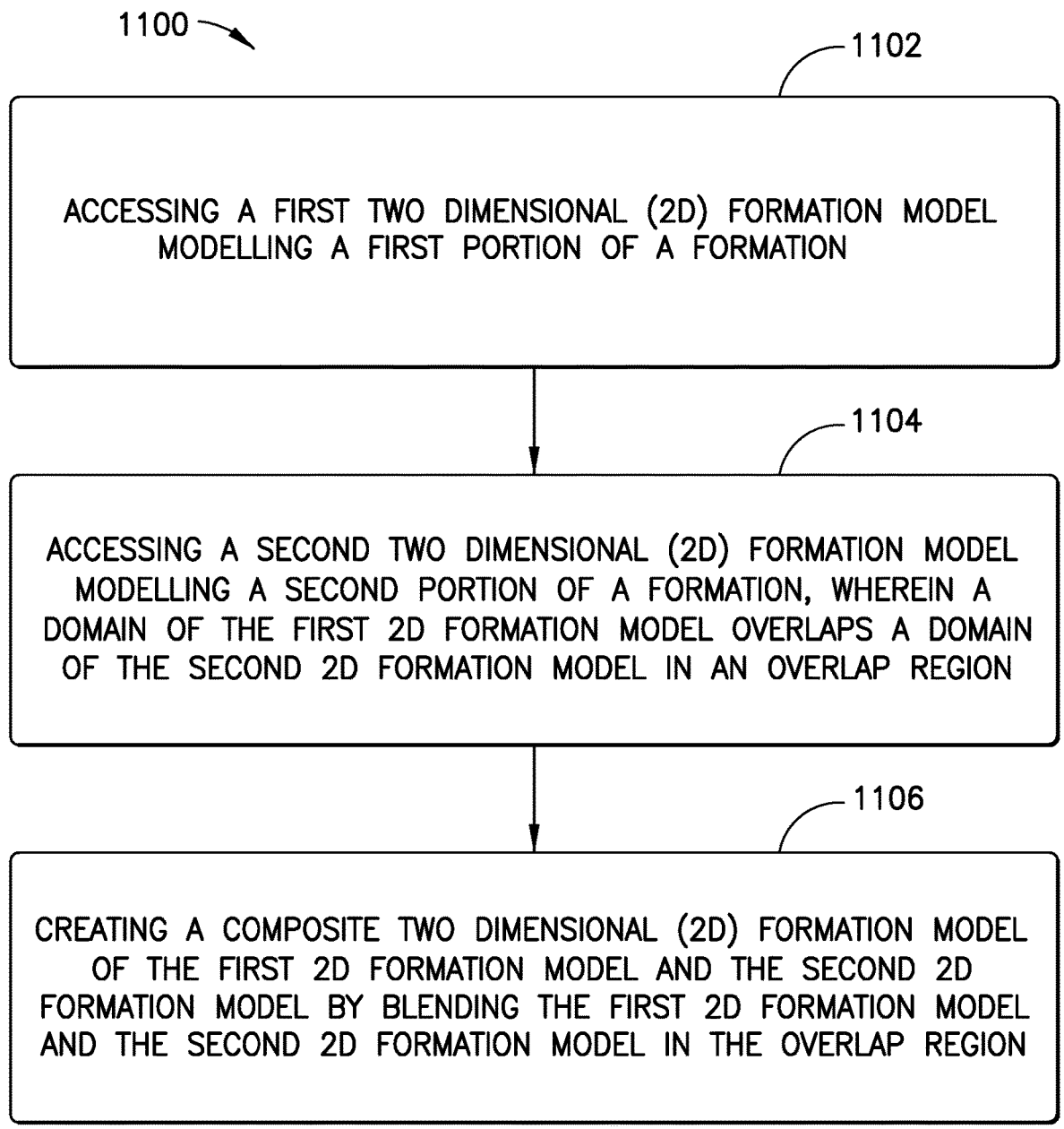
FIG. 11 illustrates another example method associated with various embodiments of two dimensional pixel-based inversion.

FIGS. 10 and 11 illustrate example methods for implementing aspects of two dimensional pixel-based inversion. The methods are illustrated as a collection of blocks and other elements in a logical flow graph representing a sequence of operations that can be implemented in hardware, software, firmware, various logic or any combination thereof. The order in which the methods are described is not intended to be construed as a limitation, and any number of the described method blocks can be combined in any order to implement the methods, or alternate methods. Additionally, individual blocks and/or elements may be deleted from the methods without departing from the spirit and scope of the subject matter described therein. In the context of software, the blocks and other elements can represent computer instructions that, when executed by one or more processors, perform the recited operations. Moreover, for discussion purposes, and not purposes of limitation, selected aspects of the methods may be described with reference to elements shown in FIGS. 1-9. Moreover, in some possible implementation, all or portions of the methods may, at least partially, be conducted using, for example, computing processing system 200.

FIG. 10 illustrates an example method 1000 associated with various embodiments of two dimensional pixel-based inversion. At block 1002, the method includes performing electromagnetic logging measurements along a portion of a borehole traversing the subterranean formation to obtain electromagnetic data. The measurements can be performed using an electromagnetic logging tool, such as a directional electromagnetic propagation tool.

At block 1004, the electromagnetic data is processed to determine a number of one dimensional formation models associated with the portion of the borehole. The one dimensional formation models comprise resistivity models with spatial distributions of anisotropic resistivity. The one dimensional formation models can be generated by performing an inversion using the electromagnetic data.

At block 1006, a two dimensional pixel grid is determined using the plurality of one dimensional formation models. The populated two dimensional pixel grid, such as populated two dimensional (2D) pixel grid 502, can be created by populating the two dimensional pixel grid with information from the plurality of one dimensional formation models. For example, in one possible implementation, a pixel, such as pixel 510, having a distinct address on the THL-TVD axis (such as the THL 402-TVD 404 axis in 2D pixel grid 502) can be populated with a pixel value (such as one or more resistivity values, anisotropy values, etc.) found in a portion of the 1D formation model at the same distinct address on the THL-TVD axis in a curtain section model, such as curtain section model 606. Such a procedure can be followed for each pixel in the 2D pixel grid such that the pixels are populated with pixel information from the various 1D formation models used to create the curtain section model.

At block 1008, the method further includes determining a two dimensional formation model for the subterranean formation by performing an inversion of the electromagnetic data using the two dimensional pixel grid. The inversion of the electromagnetic data using the two dimensional pixel grid includes (i) modeling a response of the electromagnetic tool using the two dimensional pixel grid and (ii) performing the inversion of the electromagnetic data using the two dimensional pixel grid and the modeled response. In some embodiments, the response of the electromagnetic tool is modelled for individual columns of the two dimensional pixel grid one at a time (e.g., approximate 2D inversion). In other embodiments, the response of the electromagnetic tool is modelled for a plurality of individual columns of the two dimensional pixel grid together (e.g., full 2D inversion). At block 1008, the method can further include computing a cost function using the modeled response of the electromagnetic logging tool and the electromagnetic data obtained by the electromagnetic logging tool (observed or measured response). In some embodiments, the cost function described above can be used. The inversion of the electromagnetic data can further include adjusting properties in the two dimensional pixel grid to minimize the cost function. The process of computing the cost function and adjusting the properties continues until the modelled response and measured response are similar or within a threshold.

FIG. 11 illustrates an example method 1100 associated with embodiments of two dimensional pixel-based inversion. At block 1102 a first two dimensional (2D) formation model, such as approximate 2D formation model 600, modelling a first portion of a formation, such as formation 142, is accessed.

At block 1104, a second two dimensional (2D) formation model, such as approximate 2D formation model 600(2), modelling a second portion of the formation, is accessed, wherein a domain of the first 2D formation model overlaps a domain of the second 2D formation model in an overlap region, such as overlap region 802.

At block 1106, a composite two dimensional (2D) formation model, such as composite approximate 2D formation model 804, of the first 2D formation model and the second 2D formation model is created by blending the first 2D formation model and the second 2D formation model in the overlap region. Blending can be conducted in any manner known in the art, including for example, the use of linear horizontal distance based weighted averaging.

As many adjacent 2D formation models as desired can be blended in this fashion to create the composite two dimensional (2D) formation model. Moreover, any types of 2D formation models known in the art can be used to create the composite two dimensional (2D) formation model.

For example, if several adjacent approximate 2D formation models are blended as described above, a composite approximate 2D formation model can be formed. Similarly, if several adjacent full 2D formation models are blended as described above, a composite full 2D formation model can be formed.

Although a few example embodiments have been described in detail above, those skilled in the art will readily appreciate that many modifications are possible in the example embodiments without materially departing from this disclosure. Accordingly, such modifications are intended to be included within the scope of this disclosure.

The invention claimed is:

1. A method for characterizing a subterranean formation, the method comprising:
   performing electromagnetic logging measurements along a portion of a borehole traversing the subterranean formation using an electromagnetic logging tool to obtain electromagnetic data;
   processing the electromagnetic data to determine a plurality of one dimensional formation models associated with the portion of the borehole;
   determining a two dimensional pixel grid using the plurality of one dimensional formation models, wherein pixels in the two dimensional pixel grid have a non-uniform thickness; and
   determining a two dimensional formation model for the subterranean formation by performing an inversion of the electromagnetic data using the two dimensional pixel grid.

2. The method of claim 1, wherein processing the electromagnetic data to determine a plurality of one dimensional formation models comprises performing an inversion using the electromagnetic data.

3. The method of claim 1, wherein the inversion of the electromagnetic data using the two dimensional pixel grid comprises:
   modeling a response of the electromagnetic tool using the two dimensional pixel grid; and
   performing the inversion of the electromagnetic data using the two dimensional pixel grid and the modeled response.

4. The method of claim 3, wherein the response of the electromagnetic tool is modeled for individual columns of the two dimensional pixel grid one at a time.

5. The method of claim 3, wherein the response of the electromagnetic tool is modeled for a plurality of individual columns of the two dimensional pixel grid together.

6. The method of claim 3, wherein the inversion of the electromagnetic data using the two dimensional pixel grid comprises:
   computing a cost function using the modeled response of the electromagnetic logging tool and the electromagnetic data obtained by the electromagnetic logging tool.

7. The method of claim 6, wherein the inversion of the electromagnetic data using the two dimensional pixel grid further comprises:
   adjusting properties in the two dimensional pixel grid to minimize the cost function.

8. The method of claim 1, further comprising:
   processing the electromagnetic data to determine dip associated with the portion of the borehole; and
   rotating the two dimensional pixel grid using the dip associated with the portion of the borehole.

9. The method of claim 1, further comprising:
   regularizing one or more differences between pixels in the two dimensional pixel grid in both the horizontal direction and the vertical direction.

10. The method of claim 1, wherein the inversion is a Gauss-Newton inversion that comprises at least one of Occam's adaptive regularization method, a L-curve technique, and a generalized cross-validation.

11. The method of claim 1, wherein the electromagnetic logging tool is part of a drilling bottom-hole assembly with a drill bit and the method further comprises:
   issuing one or more commands to steer a drill bit based at least partially on the two dimensional formation model.

12. The method of claim 1, wherein the plurality of one dimensional formation models comprise resistivity models with spatial distributions of anisotropic resistivity.

13. The method of claim 1, wherein a number of pixels in the two dimensional pixel grid and a distance between the pixels in the two dimensional pixel grid is chosen based on at least one of (i) a signal strength of the electromagnetic logging tool and (ii) a depth of investigation of the electromagnetic logging tool.

14. A system for characterizing a subterranean formation, the system comprising:
   an electromagnetic logging tool configured to perform electromagnetic logging measurements along a portion of a borehole traversing the subterranean formation to obtain electromagnetic data; and
   a processing system configured to: (i) process the electromagnetic data to determine a plurality of one dimensional formation models associated with the portion of the borehole, (ii) determine a two dimensional pixel grid using the plurality of one dimensional formation models, wherein pixels in the two dimensional pixel grid have a non-uniform thickness, and (iii) determine a two dimensional formation model for the subterranean formation by performing an inversion of the electromagnetic data using the two dimensional pixel grid.

15. The system of claim 14, further comprising:
   a drilling bottom-hole assembly that includes a drill bit.

16. The system of claim 15, wherein the processing system is further configured to steer the drill bit using the 2D formation model.

17. The system of claim 14, wherein the inversion of the electromagnetic data using the two dimensional pixel grid comprises (a) modeling a response of the electromagnetic tool using the two dimensional pixel grid; and (b) performing the inversion of the electromagnetic data using the two dimensional pixel grid and the modeled response.

18. The system claim 17, wherein the response of the electromagnetic tool is modeled for individual columns of the two dimensional pixel grid one at a time.

19. The system of claim 17, wherein the response of the electromagnetic tool is modeled for a plurality of individual columns of the two dimensional pixel grid together.

20. A method for characterizing a subterranean formation, the method comprising:
   accessing a first two dimensional (2D) formation model modeling a first portion of a formation;
   accessing a second 2D formation model modeling a second portion of the formation, wherein a domain of the first 2D formation model overlaps a domain of the second 2D formation model in an overlap region; and
   creating a composite 2D formation model of the first 2D formation model and the second 2D formation model by blending the first 2D formation model and the second 2D formation model in the overlap region.

21. The method of claim 20, further comprising:
   blending the first 2D formation model and the second 2D formation model in the overlap region using linear distance-based weighted averaging in the overlap region.

22. The method of claim 20, further comprising
   issuing one or more commands to steer a drill bit in the formation based at least partially on the composite 2D formation model.

23. The method of claim 20, wherein the first 2D formation model is prepared by:
   performing electromagnetic logging measurements along a first portion of a borehole traversing the formation using an electromagnetic logging tool to obtain electromagnetic data;
   processing the electromagnetic data to determine a plurality of one dimensional formation models associated with the first portion of the borehole;
   determining a two dimensional pixel grid using the plurality of one dimensional formation models, wherein pixels in the two dimensional pixel grid have a non-uniform thickness; and
   determining the first 2D formation model for the subterranean formation by performing an inversion of the electromagnetic data using the two dimensional pixel grid.

* * * * *